United States Patent
Ofuji et al.

(10) Patent No.: US 9,401,704 B2
(45) Date of Patent: Jul. 26, 2016

(54) ACTIVE MATRIX PANEL, DETECTION APPARATUS AND DETECTION SYSTEM

(71) Applicant: CANON KABUSHIKI KAISHA, Tokyo (JP)

(72) Inventors: Masato Ofuji, Honjo (JP); Chiori Mochizuki, Sagamihara (JP); Minoru Watanabe, Honjo (JP); Keigo Yokoyama, Honjo (JP); Jun Kawanabe, Kodama-gun (JP); Kentaro Fujiyoshi, Tokyo (JP); Hiroshi Wayama, Saitama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/666,901

(22) Filed: Mar. 24, 2015

(65) Prior Publication Data
US 2015/0194952 A1 Jul. 9, 2015

Related U.S. Application Data

(62) Division of application No. 13/897,590, filed on May 20, 2013, now Pat. No. 9,024,676.

(30) Foreign Application Priority Data

Jun. 6, 2012 (JP) ................................. 2012-128972

(51) Int. Cl.
*H03K 17/00* (2006.01)
*G09G 3/36* (2006.01)
(Continued)

(52) U.S. Cl.
CPC ............ *H03K 17/005* (2013.01); *G09G 3/3677* (2013.01); *G11C 19/28* (2013.01); *H01L 27/1214* (2013.01); *G09G 2310/0286* (2013.01)

(58) Field of Classification Search
CPC . H03K 17/005; H01L 27/1214; G09G 3/3677
See application file for complete search history.

(56) References Cited

U.S. PATENT DOCUMENTS

| 6,847,039 B2 | 1/2005 | Mochizuki |
| 7,205,568 B2 | 4/2007 | Watanabe et al. |

(Continued)

FOREIGN PATENT DOCUMENTS

| CN | H03-280676 A | 12/1991 |
| CN | 1751393 A | 3/2006 |
| CN | 101374463 A | 2/2009 |

OTHER PUBLICATIONS

Jan. 19, 2015 Chinese Official Action in Chinese Patent Appln. No. 201310223653.1.

*Primary Examiner* — Tony Ko
(74) *Attorney, Agent, or Firm* — Fitzpatrick, Cella, Harper & Scinto

(57) ABSTRACT

An active matrix panel includes a gate line connected to control electrodes of a plurality of transistors; and a drive circuit supplying the gate line with a conducting voltage and a non-conducting voltage. The drive circuit includes a shift register including a plurality of shift register unit circuits connected to each other, and a demultiplexer including a plurality of demultiplexer unit circuits into which output signals of the shift register unit circuits are input. The demultiplexer unit circuit includes a first transistor for supplying the gate line with the conducting voltage, and a second transistor for supplying the gate line with the non-conducting voltage. The first transistor is changed from a non-conducting state into a conducting state when the second transistor is in the conducting state.

10 Claims, 15 Drawing Sheets

(51) Int. Cl.
  *G11C 19/28* (2006.01)
  *H01L 27/12* (2006.01)

(56) References Cited

U.S. PATENT DOCUMENTS

| | | | |
|---|---|---|---|
| 7,259,037 B2 | 8/2007 | Shih | |
| 7,550,731 B2 | 6/2009 | Watanabe et al. | |
| 7,629,587 B2 | 12/2009 | Yagi et al. | |
| 7,638,772 B2 | 12/2009 | Watanabe et al. | |
| 7,750,422 B2 | 7/2010 | Watanabe et al. | |
| 7,847,263 B2 | 12/2010 | Yagi et al. | |
| 8,507,910 B2 | 8/2013 | Ofuji et al. | |
| 2004/0065840 A1 | 4/2004 | Morishita | |
| 2004/0257322 A1 | 12/2004 | Moon | |
| 2006/0071251 A1 | 4/2006 | Watanabe et al. | |
| 2007/0146520 A1 | 6/2007 | Watanabe et al. | |
| 2008/0316156 A1 | 12/2008 | Shigaki et al. | |
| 2009/0014661 A1 | 1/2009 | Yagi et al. | |
| 2009/0302229 A1 | 12/2009 | Watanabe et al. | |
| 2010/0044573 A1 | 2/2010 | Yagi et al. | |

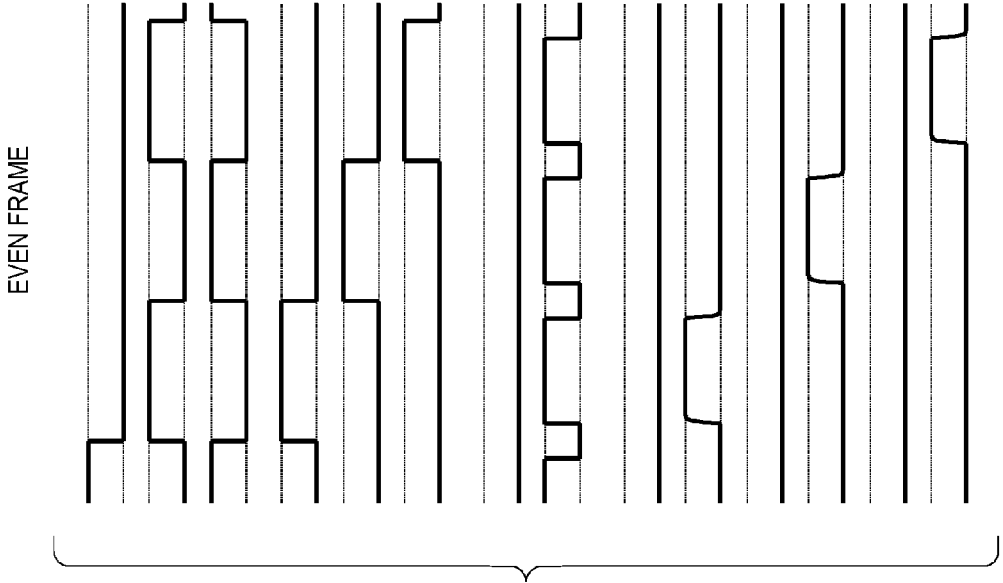
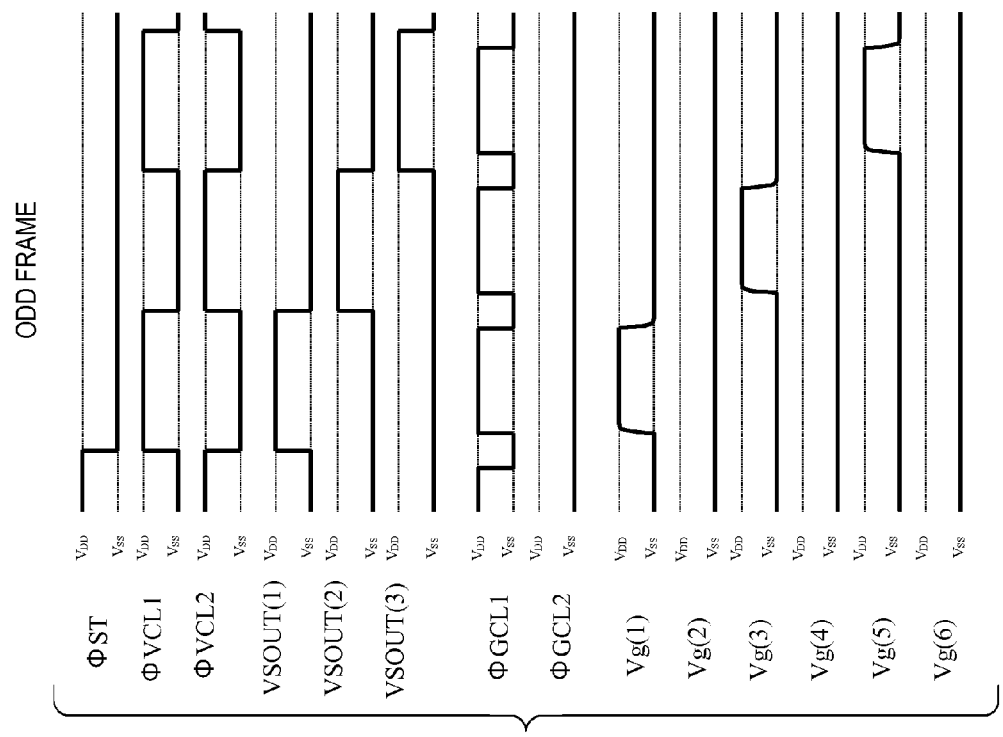

FIG. 14

| | | EMBODIMENT 1-1 | EMBODIMENT 1-2 | EMBODIMENT 1-3 |
|---|---|---|---|---|
| CHANNEL WIDTH W($\mu$m)/ CHANNEL LENGTH L($\mu$m) | T1 | 60/10 | 60/10 | 60/10 |
| | T2 | 60/10 | 60/10 | 60/10 |
| | T3 | 60/10 | 60/10 | 60/10 |
| | T4 | 60/10 | 60/10 | 60/10 |
| | T5=T5' | 30/10 | 30/10 | 30/10 |
| | T6=T6' | 1000/10 | 1000/10 | 1000/10 |
| | T7=T7' | 500/10 | 500/10 | 500/10 |
| | T8=T8' | 83/10 | 30/10 | 15/10 |
| | T9=T9' | 10/10 | 10/10 | 60/10 |

FIG. 15

| | EMBODIMENT 2-1 | EMBODIMENT 2-2 | EMBODIMENT 2-3 | EMBODIMENT 2-4 |
|---|---|---|---|---|
| CHANNEL WIDTH W(μm)/ CHANNEL LENGTH L(μm) | T1 | 60/10 | 60/10 | 60/10 | 60/10 |
| | T2 | 60/10 | 60/10 | 60/10 | 60/10 |
| | T3 | 60/10 | 60/10 | 60/10 | 60/10 |
| | T4 | 60/10 | 60/10 | 60/10 | 60/10 |
| | T5=T5' | 30/10 | 30/10 | 30/10 | 30/10 |
| | T6=T6' | 1000/10 | 1000/10 | 1000/10 | 1000/10 |
| | T7=T7' | 500/10 | 500/10 | 500/10 | 500/10 |
| | T8=T8' | 83/10 | 30/10 | 15/10 | 15/10 |
| | T9=T9' | 10/10 | 10/10 | 60/10 | 60/10 |
| | T10=T10' | 66/10 | 24/10 | 5/10 | 5/10 |
| VOLTAGE $V_{GG}$(V) | | $V_{SS}+2$ | $V_{SS}+2$ | $V_{SS}+2$ | $V_{SS}$ |

ACTIVE MATRIX PANEL, DETECTION APPARATUS AND DETECTION SYSTEM

This application is a division of Application Ser. No. 13/897,590 filed May 20, 2013.

BACKGROUND OF THE INVENTION

1. Field of the Invention

The present invention relates to an active matrix panel, a detection apparatus and a detection system.

2. Description of the Related Art

An active matrix panel having an array of pixels (pixel array) including switching elements, such as thin film transistors (TFTs) is manufactured using a thin film semiconductor manufacturing technology. In recent years, in the active matrix panel, a system-on-panel design is required to be adopted. This design involves integrally forming drive circuits, such as gate driver circuits, on a substrate in a TFT process. Particularly, for a detection apparatus having an array of pixels (pixel array) where a switching element and a conversion element, such as a photoelectric conversion element, are combined, the system-on-panel design is required in order to reduce the pixel pitch, the number of components and the border width. The system-on-panel-type gate driver circuit used for such a detection apparatus has the following technical problems.

(1) Function of Switching the Number of Driving Gate Lines

A drive circuit sequentially applies a voltage (conducting voltage) for making pixel TFTs connected to one to a several gate lines be conductive. In the case where the number of gate lines to be driven at one time is one, the mode is a normal (high resolution) mode. In the case where the number is plural, the mode is a pixel addition (high sensitive) mode, in which light signal charges of pixels are added. Particularly, in a radiation detection apparatus, these modes can be switched to acquire optimal images while radiation exposure doses to patients are suppressed.

(2) Stabilization of Gate Line Potential During Non-Selected Period

Even in a time period where a conducting voltage is applied to a certain gate line, no conducting voltage is applied to most of gate lines. When the gate lines come into a floating state, the voltage of the gate line varies owing to capacitance coupling with a signal line and external electromagnetic fields, thereby reducing readout image quality. Particularly, an active matrix panel for a radiation detection apparatus has gate lines about three times as many as those of a display device, while measuring the charge amount of pixels at high resolution. Accordingly, it is particularly important to stabilize the gate line voltage during a time period (non-selected period) where no conducting voltage is applied.

U.S. 2008/0316156 discloses a drive circuit for a liquid crystal display device (LCD) as a circuit that solves problems analogous to the above problems. The drive circuit is formed as single-conducting TFT integrally with a substrate. The drive circuit in U.S. 2008/0316156 includes a shift register and a scan voltage generation circuit. The scan voltage generation circuit functions as a demultiplexer that branches the output voltage of the shift register into a plurality of gate lines. The number of gate lines driven at a time can be changed by controlling the timing of clocks to be provided to a scan voltage generation circuit. The shift register can output not only a main output signal (first shift pulse voltage) but also a complementary output signal thereof (second shift pulse voltage). Through use of these signals, during the most of the non-selected period, the gate lines are connected to a DC power source and the floating state of the gate line can be avoided.

However, since the shift register in U.S. 2008/0316156 outputs two types of output signals, which are the first and second shift pulses, this register has a complicated circuit configuration. The shift register in U.S. 2008/0316156 includes 18 TFTs for each unit circuit. Even if redundant TFTs, such as Tr1 and Tr2 in FIG. 4 in U.S. 2008/0316156 are counted as one TFT, the register includes 10 TFTs for each unit circuit. The drive circuit with such a complicated circuit configuration has a large layout area, and causes reduction of manufacturing yield.

The present invention has an object to reduce the layout area of a drive circuit for gate lines in an active matrix panel and improve the manufacturing yield.

SUMMARY OF THE INVENTION

An active matrix panel of the present invention includes: a gate line connected to control electrodes of a plurality of transistors; and a drive circuit supplying the gate line with a conducting voltage and a non-conducting voltage, wherein the drive circuit includes a shift register including a plurality of shift register unit circuits connected to each other, and a demultiplexer including a plurality of demultiplexer unit circuits into which output signals of the shift register unit circuits are input, the demultiplexer unit circuit includes a first transistor for supplying the gate line with the conducting voltage, and a second transistor for supplying the gate line with the non-conducting voltage, and the first transistor is changed from a non-conducting state into a conducting state when the second transistor is in the conducting state.

The present invention can reduce a circuit scale of the shift register and the layout area of the drive circuit, and improve the manufacturing yield.

Further features of the present invention will become apparent from the following description of exemplary embodiments with reference to the attached drawings.

BRIEF DESCRIPTION OF THE DRAWINGS

FIG. 7A is a timing chart illustrating an example of an operation of an odd frame in an interlace mode relating to the first embodiment.

FIG. 7B is a timing chart illustrating an example of an operation of an even frame in an interlace mode relating to the first embodiment.

FIG. 14 is a diagram illustrating examples of channel widths and channel lengths of thin film transistors in the first embodiment.

FIG. 15 is a diagram illustrating examples of channel widths and channel lengths of thin film transistors in the second embodiment.

DESCRIPTION OF THE EMBODIMENTS

Preferred embodiments of the present invention will now be described in detail in accordance with the accompanying drawings.

First Embodiment

Figure 1:
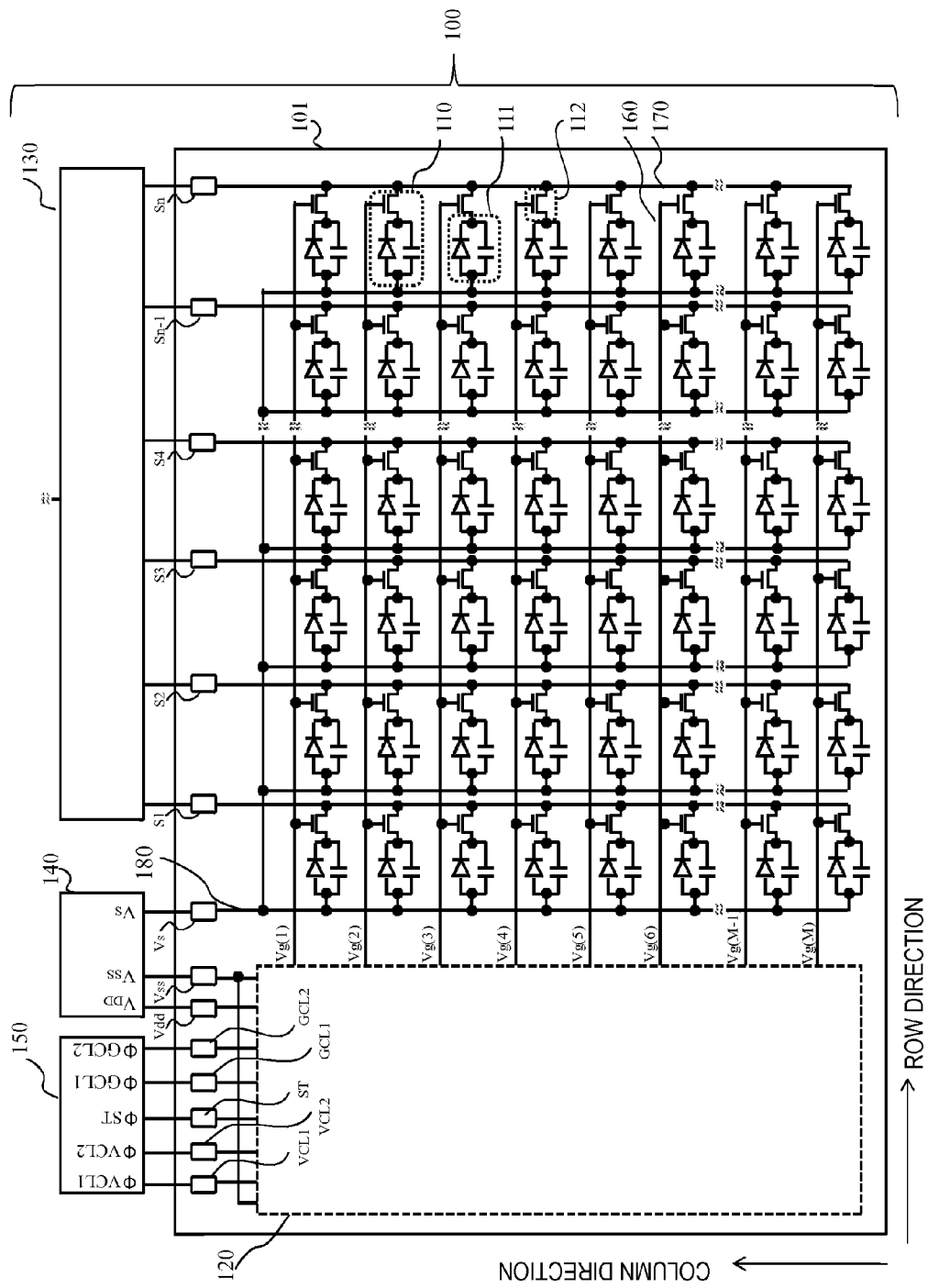
FIG. 1 is a diagram illustrating a configurational example of an active matrix panel according to a first embodiment.

FIG. 1 is a diagram illustrating a configurational example of a detection apparatus including an active matrix panel according to a first embodiment of the present invention. As illustrated in FIG. 1, a detection apparatus 100 includes a pixel array in which pixels 110 are arranged into a matrix on an insulating substrate 101. In this embodiment, the pixel array is arranged into M rows and N columns, where M is an even number. The pixel 110 includes a conversion element 111 converting radiation or light into a charge, and a switching element (transistor) 112 outputting an electric signal according to the converted charge. A first electrode of the conversion element 111 is electrically connected with one of a source and a drain of the switching element 112. A second electrode of the conversion element 111 is electrically connected with an electrode wiring 180. The other one of the source and the drain of the switching element 112 is electrically connected with a signal line 170. A plurality of signal lines 170 (N lines) are arranged in a column direction. Each signal line is connected, in a shared manner, to the other ones of the sources and the drains of the switching elements 112 arranged in the column direction. The signal lines are further connected to an external readout circuit 130 via respective connection terminals S1 to Sn. The control electrodes (gate electrodes) of the switching elements 112 are electrically connected with a gate line 160. A plurality of gate lines 160 (M lines) are arranged in a row direction. Each gate line is connected, in a shared manner, to the gates of the switching elements 112 arranged in the row direction. The gate lines are further connected to a drive circuit 120 provided on the insulating substrate 101. The drive circuit 120 supplies the gate line 160 with a conducting voltage and a non-conducting voltage.

Figure 2B:
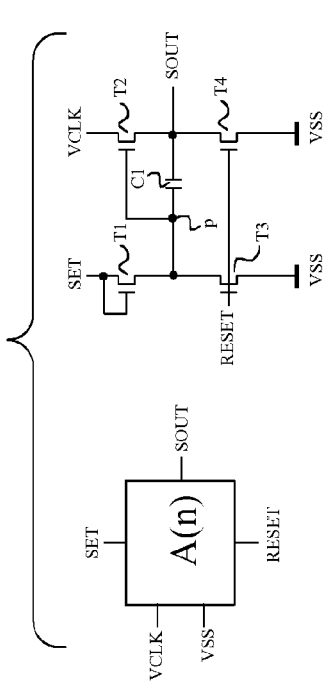
FIG. 2B is a diagram illustrating a configurational example of a shift register unit circuit.
Figure 2C:
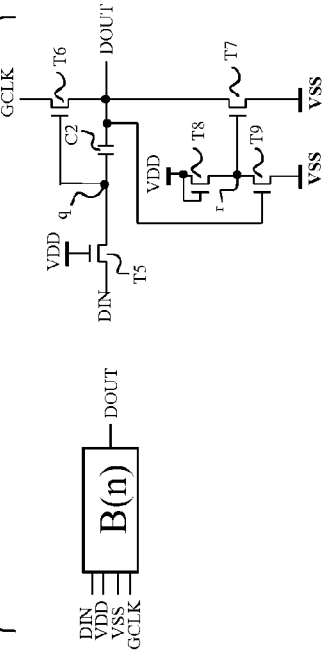
FIG. 2C is a diagram illustrating a configurational example of a demultiplexer unit circuit.
Figure 2A:
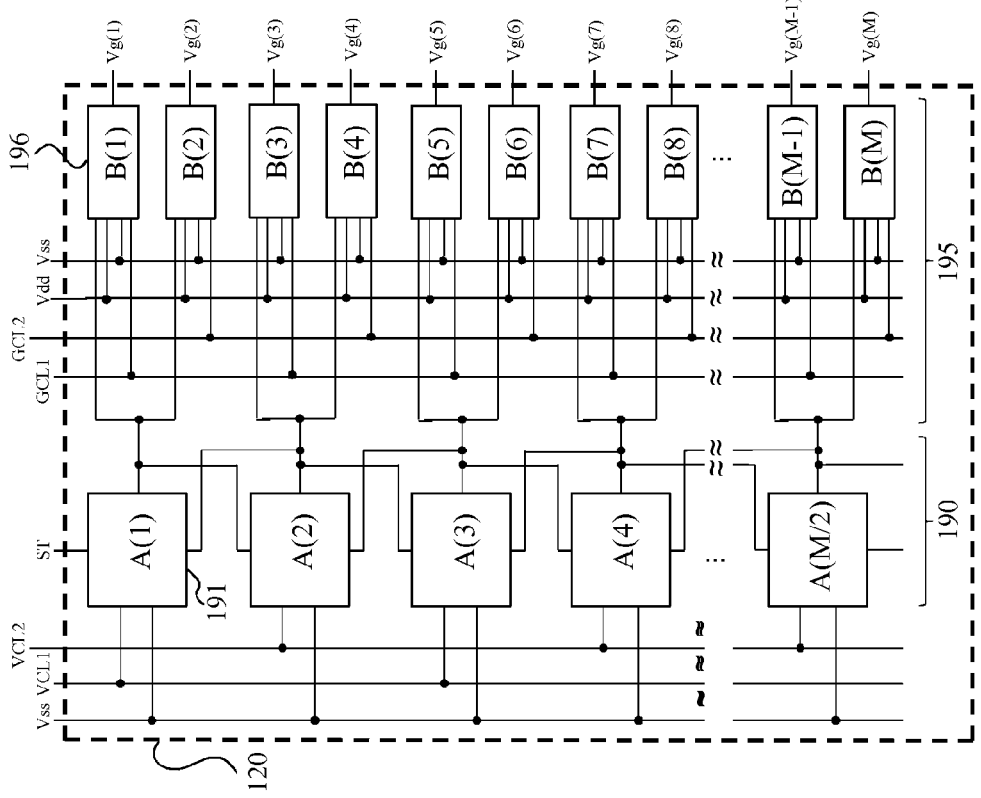
FIG. 2A is a diagram illustrating a configurational example of a drive circuit relating to the first embodiment.

The drive circuit 120 is connected to a power source 140 via connection terminals Vdd and Vss, and connected to a controller 150 via connection terminals VCL1, VCL2, ST, GCL1 and GCL2. The power source 140 supplies the electrode wiring 180 with a voltage $V_S$ to be supplied to the conversion element 111, and supplies the drive circuit 120 with a first voltage $V_{DD}$ for causing the switching element 112 to be in a conducting state, and a second voltage $V_{SS}$ for causing the element to be in a non-conducting state. The controller 150 supplies the drive circuit 120 with a start signal ΦST, clock signals ΦVCL1 and ΦVCL2 of a shift register 190, and clock signals ΦGCL1 and ΦGCL2 of a demultiplexer 195 (FIG. 2A). The start signal ΦST is a signal for starting operation of the shift register 190 (FIG. 2A). The maximum voltage value of the start signal ΦST, the clock signals ΦVCL1, ΦVCL2, ΦGCL1 and ΦGCL2 is $V_{DD}$, and the minimum voltage value thereof is $V_{SS}$. The clock signals ΦVCL1 and ΦVCL2 have phases different from each other by 180 degrees. The $V_{DD}$ and $V_{SS}$ are set so as to satisfy $|V_{DD}-V_{SS}|>2V_{TH}$, where a threshold voltage $V_{TH}$ is of thin film transistors configuring the drive circuit 120.

FIG. 2A is a diagram illustrating a configurational example of the drive circuit 120. The drive circuit 120 includes the shift register 190 and the demultiplexer 195. The shift register 190 includes at least M/2 shift register unit circuits 191 connected to each other. The shift register unit circuits 191 are denoted by A(1), A(2), . . . , A(M/2) from the head thereof. As illustrated in FIG. 2B, the shift register unit circuit A(n) has signal input terminals SET, RESET and VCLK, a power source input terminal VSS and a signal output terminal SOUT. A signal input terminal SET of the shift register unit circuit A(n) is connected with the signal output terminal SOUT of the shift register unit circuit A(n−1). In addition, the start signal ΦST is input into the signal input terminal SET of the shift register unit circuit A(1). The signal input terminal RESET of the shift register unit circuit A(n) is connected with the signal output terminal SOUT of the shift register unit circuit A(n+1). A desired control signal generated by the controller 150 or the like may be input into the signal input terminal RESET of the shift register unit circuit A(M/2) at the final stage, for securely finishing the shift register operation. The clock signal ΦVCL1 is input into the signal input terminal VCLK of the odd-numbered shift register unit circuits A(n). The clock signal ΦVCL2 is input into the signal input terminal VCLK of the even-numbered shift register unit circuits A(n). The second voltage $V_{SS}$ is input into the power source input terminal VSS of the shift register unit circuit A(n). The signal output terminal SOUT of the shift register unit circuit A(n) is connected with signal input terminals DIN of after-mentioned demultiplexer unit circuits B(2n−1) and B(2n).

The demultiplexer 195 includes M or more demultiplexer unit circuits 196. The demultiplexer unit circuits 196 are denoted by B(1), B(2), . . . , B(M) from the head thereof. In this embodiment, two demultiplexer unit circuits 196 correspond to one shift register unit circuit 191. The demultiplexer unit circuits 196 receive output signals of the shift register unit circuits 191. As illustrated in FIG. 2C, the demultiplexer unit circuit B(n) includes signal input terminals DIN and a GCLK, power source input terminals VDD and VSS, and a signal output terminal DOUT. The clock signal ΦGCL1 is input into the signal input terminal GCLK of the odd-numbered demultiplexer unit circuits B(n). The clock signal ΦGCL2 is input into the signal input terminals GCLK of the even-numbered demultiplexer unit circuits B(n). The first voltage $V_{DD}$ and the second voltage $V_{SS}$ are input into the respective power source input terminals VDD and VSS of the demultiplexer unit circuit B(n). The signal output terminals DOUT of the demultiplexer unit circuit B(n) is connected with the respective gate line corresponding thereto.

FIG. 2B illustrates an example of an internal configuration of the shift register unit circuit A(n). The shift register unit circuit A(n) includes thin film transistors T1 to T4 and a capacitance element C1. FIG. 2C illustrates an example of an internal configuration of the demultiplexer unit circuit B(n). The demultiplexer unit circuit B(n) includes thin film transistor T5 to T9 and a capacitance element C2. A first transistor T6 is a transistor for supplying the conducting voltage to the gate line 160 via the output terminal DOUT. A second transistor T7 is a transistor for supplying the non-conducting voltage to the gate line 160 via the output terminal DOUT. The thin film transistors T8 and T9 form an E/E inverter of which power source voltages are $V_{DD}$ and $V_{SS}$, respectively. The inverter includes a third transistor T8 supplying the first voltage $V_{DD}$ to the control electrode (gate electrode) of the second transistor T7, and a fourth transistor T9 supplying the second voltage $V_{SS}$ to the control electrode of the second transistor T7. The inverter receives the potential of the mutual connection node DOUT of the first transistor T6, the second transistor T7 and the gate line 160 as an input signal, and outputs a signal inverted from the input signal to the control electrode of the second transistor T7. In the case where the input voltages to the inverter (the gate voltage of the thin film transistor T8 and the source voltage of the thin film transistor T9) are $V_{DD}$ and $V_{SS}$, respectively, the output voltage of the inverter, that is, a voltage Vr at a point r is $V_L$ or $V_H$. $V_H=V_{DD}-V_{TH}$ is satisfied. $V_L$ varies according to $\beta_{R9}$, which is the W/L ratio of the thin film transistor T9 with respect to the W/L ratio of the thin film transistor T8.

$\beta_{R9}=(W_9/L_9)/(W_8/L_8)$, where, hereinafter, W denotes the channel width, L denotes the channel length, and the subscript denotes the corresponding transistor number (T1, T2, . . . ). For instance, the channel width and the channel length of the first transistor T6 are defined as $W_6$ and $L_6$, respectively. The channel width and the channel length of the second transistor T7 are defined as $W_7$ and $L_7$, respectively. The channel width and the channel length of the third transistor T8 are defined as $W_8$ and $L_8$. The channel width and the channel length of the fourth transistor T9 are defined as $W_9$ and $L_9$. Three or more demultiplexer unit circuits 196 can be connected to one shift register unit circuit 191. For instance, in the case of connecting four demultiplexer unit circuits 196 to one shift register unit circuit 191, the number of shift register unit circuits 191 is at least M/4, and four series of clock signal, such as ΦGCL1 to ΦGCL4, are adopted. Each of the thin film transistors configuring the switching element 112 and the drive circuit 120 may be made of any of amorphous semiconductor material (e.g., amorphous silicon), polycrystalline semiconductor material (e.g., polycrystalline silicon), organic semiconductor material, and oxide semiconductor material.

Next, operations of the drive circuit 120 will be described separately regarding (1) shift register and (2) demultiplexer. Here, the threshold voltage of each of the thin film transistors T1 to T9 is $V_{TH}$. In the case where the threshold voltages of the thin film transistors are different from each other, if the average value of the threshold voltages of the related thin film transistors is defined as $V_{TH}$, the following discussion can be made effective.

(1) Shift Register

Figure 3:
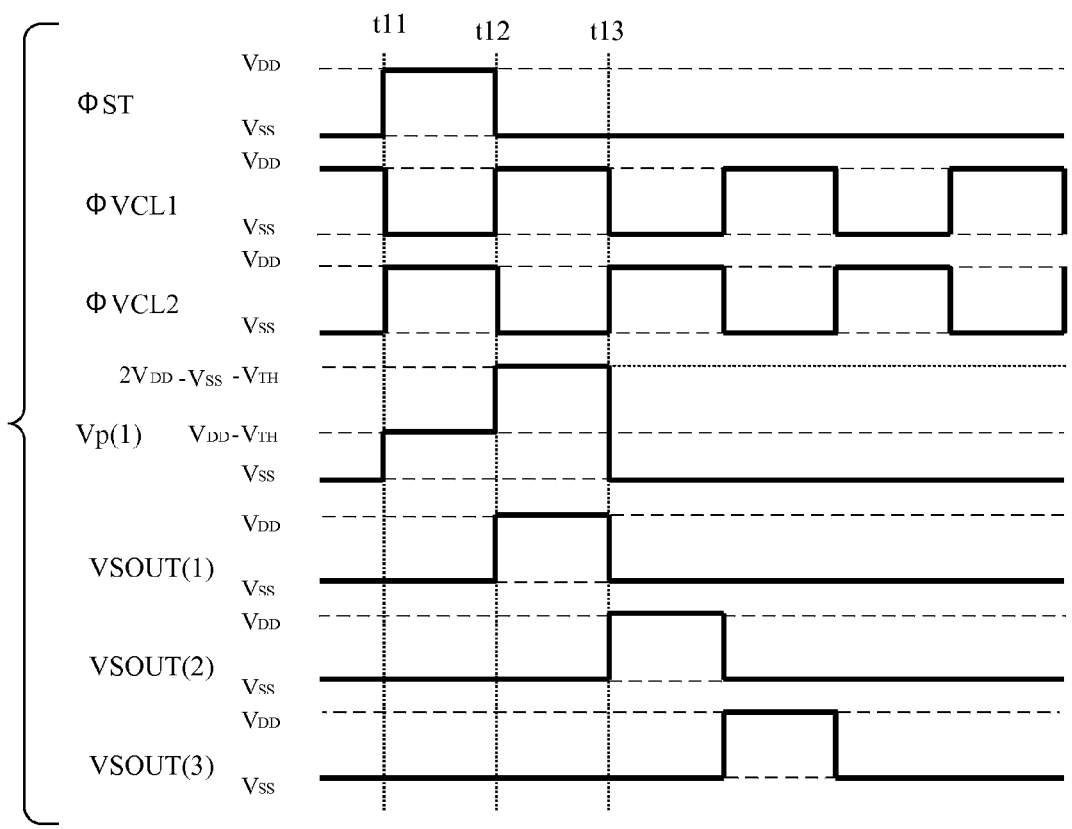
FIG. 3 is a timing chart illustrating an example of an operation of a shift register relating to the first embodiment.

Referring to FIGS. 2A, 2B and 3, the operation of the shift register 190 will be described. The start signal ΦST is input into the signal input terminal SET of the shift register unit circuit A(1). The clock signal ΦVCL1 is input into the signal input terminal VCLK. The output signal VSOUT(2) of the shift register unit circuit A(2) is input into the signal input terminal RESET. The output signal VSOUT(1) of the shift register unit circuit A(1) is input into the signal input terminal SET of the shift register unit circuit A(2). The clock signal ΦVCL2 is input into the signal input terminal VCLK. The output signal VSOUT(3) of the shift register unit circuit A(3) is input into the signal input terminal RESET.

FIG. 3 is a timing chart illustrating the operation of the shift register 190. This diagram also illustrates the temporal variation of the voltage Vp(1) at a point p in the shift register unit circuit A(1) at the first stage.

First, the operation of the shift register unit circuit A(1) is discussed. At time t11, when the start signal ΦST rises, the voltage Vp(1) is increased by the thin film transistor T1 to about $V_{DD}-V_{TH}$, and the thin film transistor T2 comes into the conducting state. At time t12, the start signal ΦST falls and the clock signal ΦVCL1 rises. The clock signal ΦVCL1 is input into the signal input terminal VCLK of the shift register unit circuit A(1), and the gate electrode and the source electrode of the thin film transistor T2 are connected to each other via the capacitance element C1. Accordingly, the voltage Vp(1) is increased to about $(2V_{DD}-V_{SS}-V_{TH})$ (bootstrap operation). Here, if $(2V_{DD}-V_{SS}-V_{TH})>(V_{DD}+V_{DD})$, VSOUT(1)=$V_{DD}$. At time t13, when the clock signal ΦVCL1 falls and the clock signal ΦVCL2 rises, VSOUT(2)=$V_{DD}$ holds. Accordingly, the thin film transistors T3 and T4 become conductive, and VSOUT(1)=$V_{SS}$ holds.

Next, the operation of the second shift register unit circuit A(2) is discussed. The shift register unit circuit A(2) is triggered by the state of VSOUT(1)=$V_{DD}$ at time t12 to operate in a manner analogous to the shift register unit circuit A(1) with a delay of a prescribed time period (=t13−t12) from the shift register unit circuit A(1).

Likewise, the shift register unit circuit A(n+1) operates in a manner analogous to the shift register unit circuit A(n) with a delay of the prescribed time from the shift register unit circuit A(n). The repetitive operations allow the shift register 190 to sequentially supply the VSOUT(n) with the $V_{DD}$ voltage pulse, as illustrated in FIG. 3.

(2) Demultiplexer

Figure 4:
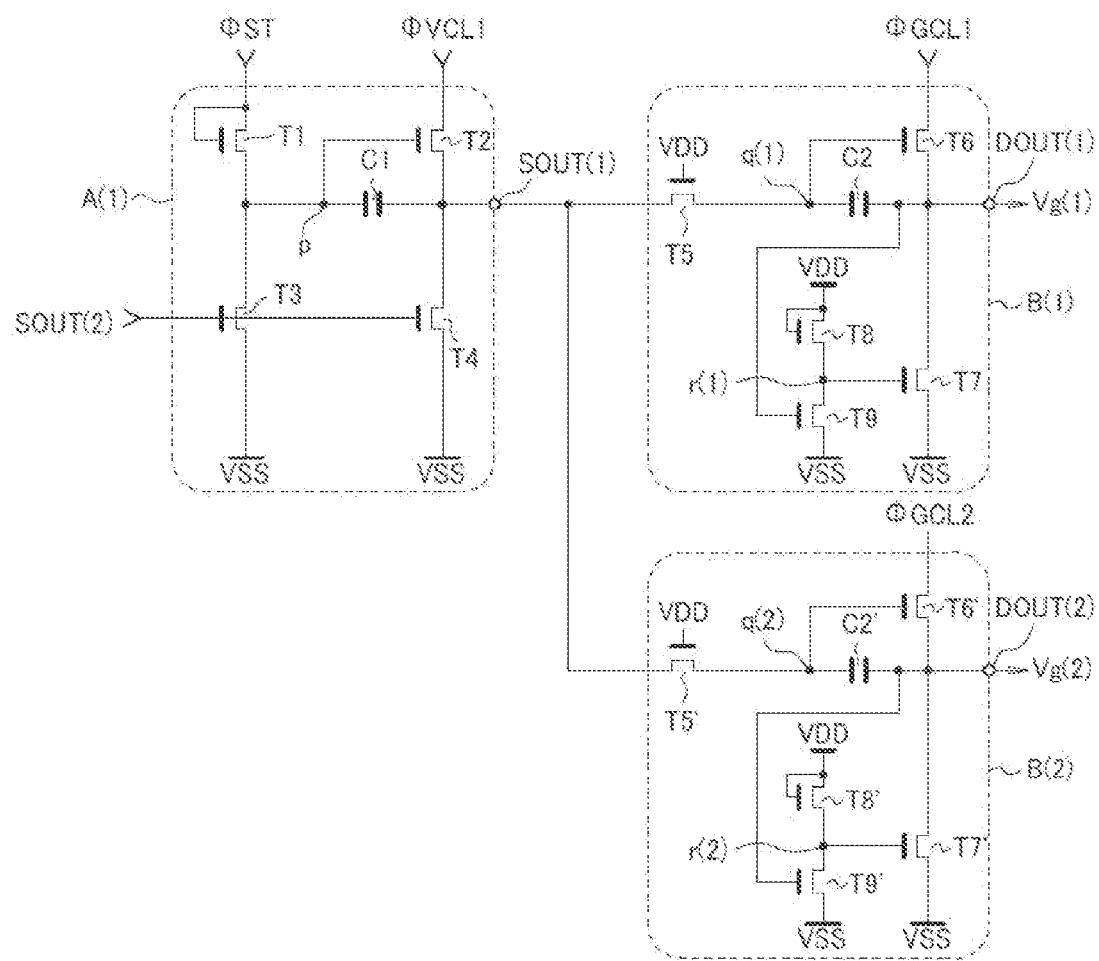
FIG. 4 is a circuit diagram illustrating in detail a leading section of the drive circuit relating to the first embodiment.

Referring to FIGS. 2A, 2C, 4, 5 and 6, the operations of the demultiplexer 195 will be described. FIG. 4 is a circuit diagram illustrating a leading section of the drive circuit 120 in detail. This diagram illustrates the shift register unit circuit A(1) and the demultiplexer unit circuits B(1) and B(2). The output voltages at the signal output terminals DOUT of the demultiplexer unit circuits B(1) and B(2) are defined as output voltages Vg(1) and Vg(2) to the gate lines on the first and second rows, respectively. The demultiplexer 195 can operate in any of a normal mode, a pixel addition mode and an interlace mode.

(2-1) Normal Mode

Figure 5:
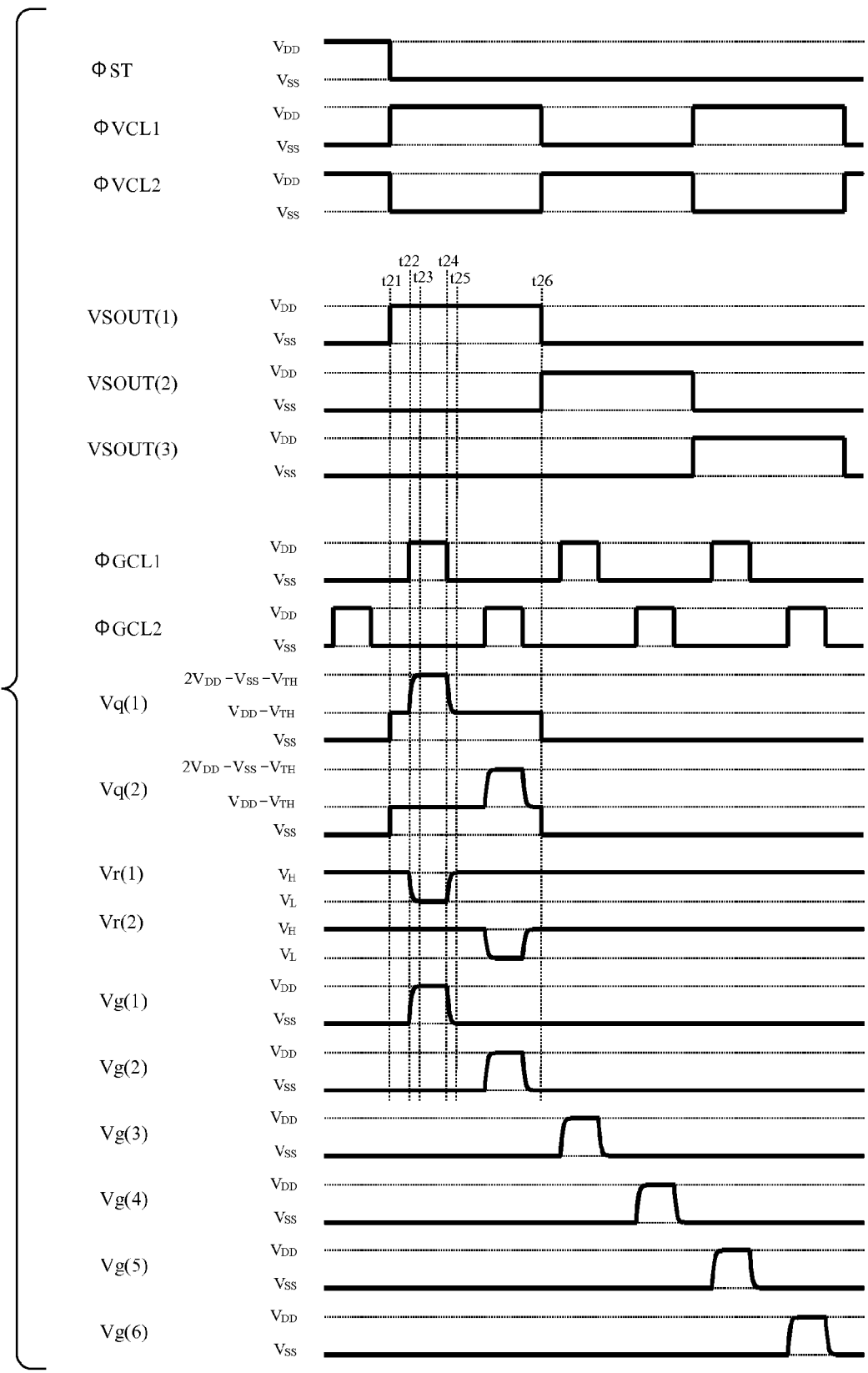
FIG. 5 is a timing chart illustrating an example of an operation in a normal mode relating to the first embodiment.

FIG. 5 is a timing chart illustrating the operations of the demultiplexer unit circuits B(1) and B(2) in the normal mode. The clock signals ΦGCL1 and ΦGCL2 have phases different from each other by 180 degrees. The temporal variation in voltages Vq(1), Vq(2), Vr(1) and Vr(2) at points q and r in the demultiplexer unit circuits B(1) and B(2) are also illustrated. Hereinafter, the operations will be sequentially described.

(A) Before Time t21

VSOUT(1)=Vq(1)=Vq(2)=$V_{SS}$ holds and the thin film transistors T6 and T6' are in the non-conducting state. Vr(1)=Vr(2)=$V_H$, and Vg(1)=Vg(2)=$V_{SS}$ are satisfied. The thin film transistors T7 and T7' are in the conducting state.

(B) Time t21

When VSOUT(1)=$V_{DD}$ is satisfied, the voltages Vq(1) and Vq(2) are charged to $V_{DD}-V_{TH}$. As a result, the thin film transistors T6 and T6' are in the conducting state until after-mentioned time t26. ΦGCL1=ΦGCL2=$V_{SS}$, and Vr(1)=Vr(2)=$V_H$ are satisfied. The thin film transistors T7 and T7' are in the conducting state. Vg(1)=Vg(2)=$V_{SS}$ is satisfied. That is, the first transistors T6 and T6' are changed from the non-conducting state to the conducting state when the second transistors T7 and T7' are in the conducting state.

(C) Time t22

The gate line has a parasitic resistance $R_{para}$ and a parasitic capacitance $C_{para}$, whose components are resistances of metal materials, intersection capacitance between the gate lines and the signal lines in the pixel region, and intersection capacitances with various wirings up to the pixel region. Accordingly, the gate line is charged and discharged with a delay of about $\tau = R_{para} \times C_{para}$ (sec.). At the instant of time t22, when the clock signal ΦGCL1 rises, the voltage Vg(1) is not immediately changed, and Vg(1)=$V_{SS}$, Vg(1)=$V_{DD}$-$V_{TH}$, and Vr(1)=$V_H$ are satisfied. The thin film transistor T7 is in the conducting state.

(D) Time t23

When about a time period τ elapses after time t22, the voltage Vq(1) is increased to $2V_{DD}$-$V_{SS}$-$V_{TH}$ and the voltage Vg(1) becomes a constant value (=$V_{DD}$) because the gate electrode and the source electrode of the thin film transistor T6 are connected to each other via the capacitance element C2. At this time, the voltage Vr(1) becomes a value (=$V_L$) determined by the channel resistance ratio of the thin film transistors T8 and T9, and the thin film transistor T7 comes into the non-conducting state. As described above, after the voltage Vg(1) of the gate line 160 is changed to the conducting voltage $V_{DD}$, the fourth transistor T9 becomes conductive, the voltage Vr(1) becomes the voltage $V_L$, and the second transistor T7 comes into the non-conducting state. After the voltage of the gate line 160 is changed to the conducting voltage $V_{DD}$, the voltage Vr(1) of the control electrode of the second transistor T7 becomes the voltage $V_L$ that is not more than the threshold voltage $V_{TH}$ of the second transistor T7.

(E) Time t24

At the instant of time t24, when ΦGCL1=$V_{SS}$ gets satisfied, the voltage Vg(1) is not immediately changed, as with time t22, and Vg(1)=$V_{DD}$, Vq(1)=$2V_{DD}$-$V_{SS}$-$V_{TH}$ and Vr(1)=$V_L$ are satisfied. The thin film transistor T7 is in the non-conducting state.

(F) Time t25

When about a time period τ elapses after time t24, the voltage Vq(1) is reduced to $V_{DD}$-$V_{TH}$. Vg(1)=$V_{SS}$ and Vr(1)=$V_H$ are satisfied. The thin film transistor T7 comes into the conducting state. Then, up to time t26, the state where ΦGCL1=$V_{SS}$ and Vg(1)=$V_{SS}$ are satisfied is maintained.

(G) After time t25

The demultiplexer unit circuit B(2) operates in a manner analogous to the above ones. That is, voltages Vq(2), Vr(2) and Vg(2) and the conducting/non-conducting state of the thin film transistor T7' vary according to transition of the clock signal ΦGCL2, as described above.

(H) Time t26

VSOUT(1)=$V_{SS}$ is satisfied. The thin film transistors T6 and T6' come into the non-conducting state. Both the thin film transistors T7 and T7' are in the conducting state. Vg(1)=Vg(2)=$V_{SS}$ and Vr(1)=Vr(2)=$V_H$ are satisfied.

(I) After time t26

Unless the VSOUT(1) becomes $V_{DD}$ again, the thin film transistors T6 and T6' are maintained in the non-conducting state. Both the thin film transistors T7 and T7' are maintained in the conducting state. The state where Vg(1)=Vg(2)=$V_{SS}$ and Vr(1)=Vr(2)=$V_H$ are satisfied is stably maintained. That is, irrespective of the states of the clock signals ΦGCL1 and ΦGCL2, the gate lines on the first and second rows are connected to the second voltage $V_{SS}$ by the thin film transistors T7 and T7', which are in the conducting state, and are not in the floating state.

As described above, from (A) to (I), at least one of the thin film transistors T6 and T7 (T6' and T7') is in the conducting state. Accordingly, the gate line on the first row (second row) does not come into the floating state. In conformity with the operations of the shift register unit circuit A(2), A(3), . . . , the demultiplexer unit circuit B(3) and subsequent circuits operate in an analogous manner. The gate lines on and after the third row are not in the floating state.

Typically, the power source 140 has more current supplying capacity than the controller 150 has, and is more resistant to noise due to external electromagnetic fields. To improve the image quality of the detection apparatus 100, the gate line during the time period where the first voltage $V_{DD}$ are not applied can be connected not only to the clock signal ΦGCL1 generated by the controller 150 but also to the second voltage $V_{SS}$ supplied by the power source 140. In this embodiment, the time period where the thin film transistor T7 (corresponding to Tr28 in U.S. 2008/0316156) is in the conducting state is longer than that in U.S. 2008/0316156. As a result, this embodiment allows the gate line during the non-selected period to be connected to the second voltage $V_{SS}$ in a longer time and high image quality can be achieved.

(2-2) Pixel Addition Mode

Figure 6:
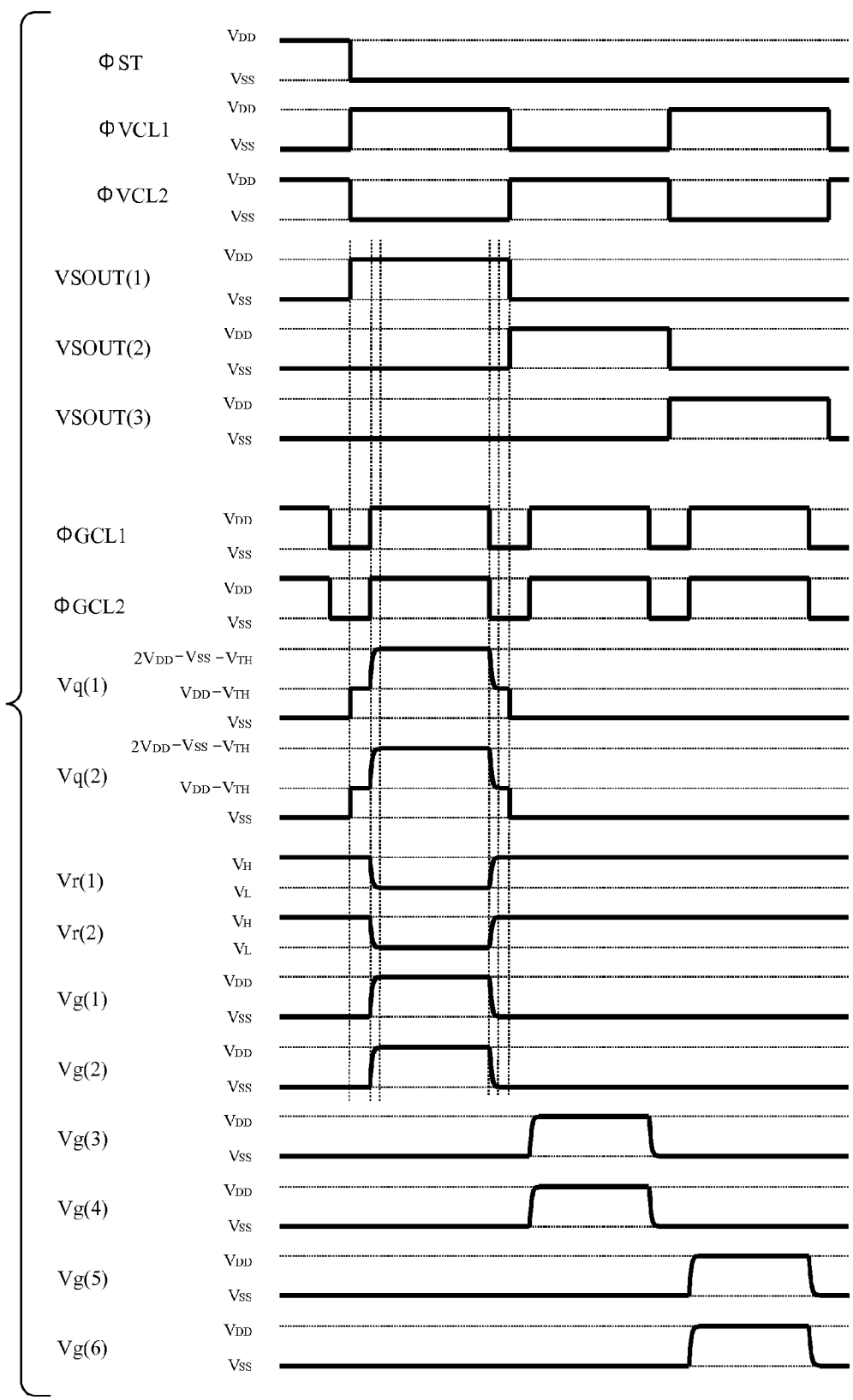
FIG. 6 is a timing chart illustrating an example of an operation in a pixel addition mode relating to the first embodiment.

FIG. 6 is a timing chart illustrating operations of demultiplexer unit circuits B(1) and B(2) in the pixel addition mode. The pixel addition mode is different from the normal mode in that the clock signals ΦGCL1 are ΦGCL2 have the same phase. Accordingly, the gate line potentials on the odd-numbered and even-numbered rows can be driven at the same time. As a result, the combined signal charges of the pixels 110 on two rows selected by the drive circuit 120 can be read by the readout circuit 130.

(2-3) Interlace Mode

FIG. 7 is a timing chart illustrating operations of the demultiplexer unit circuits B(1) and B(2) in the interlace mode. The interlace mode is different from the normal mode in that the pulses of the first voltage $V_{DD}$ are supplied only to the clock signal ΦGCL1 on the odd frames and the pulses of the first voltage $V_{DD}$ are supplied only to the clock signal ΦGCL2 on the even frames. U.S. 2008/0316156 discloses driving operation in such a mode. However, in U.S. 2008/0316156, both the odd-numbered and even numbered rows are connected to a common shift register unit circuit. Accordingly, on the odd frames, the thin film transistors T7' connected to gate lines on even-numbered rows where signals are not read are also in the non-conducting state. In this embodiment, the thin film transistors T7' in the odd frames (the thin film transistors T7 in the even frames) are always in the conducting state. As a result, in this embodiment, high image quality can be achieved. In particular, in the case of connecting three or more demultiplexer unit circuits 196 to one shift register unit circuit 191, the image quality is expected to markedly be improved according to this embodiment.

FIG. 14 illustrates an example of the channel width and the channel length of each thin film transistor applicable to this embodiment. It is defined that C1=0.5 pF and C2=10 pF. From time t22 to time t23, the inverter is securely inverted, and the voltage Vg(1) is increased to $V_{DD}$. Accordingly, the W/L ratio (=($W_6/L_6$)/($W_7/L_7$)) of the thin film transistor T6 with respect to the W/L ratio of the thin film transistor T7 is set to have at least an equal value. For instance, in this embodiment, the value is two. To allow the thin film transistor T7 at time t23 to substantially be regarded as the non-conducting state, any of the following conditions (a) and (b) are required to be satisfied at the same time.

(a) Channel Resistance of the Thin Film Transistor T7 100 Times or More as High as the Channel Resistance of the Thin Film Transistor T6

To allow the thin film transistor T7 at time t23 to substantially be regarded as the non-conducting state, the voltage error of the output voltage Vg(n) at the this time is required to be 1% or less, i.e., $\Delta=(V_{DD}-Vg(n))/(V_{DD}-V_{SS})\geq 0.01$ is required to be satisfied. To satisfy this condition, the channel resistance of the thin film transistor T7 is required to be 100 times or more as high as the channel resistance of the thin film transistor T6 at the same time. That is, after the voltage of the gate line 160 is changed to the conducting voltage $V_{DD}$, the channel resistance ratio of the second transistor T7 to the first transistor T6 is required to be 100 times or more.

To verify whether the condition is satisfied or not, the voltage Vg(n) at the same time may be actually measured. Instead, through use of an appropriate circuit model (RPI a-Si:H TFT model or RPI poly-Si TFT model), the SPICE simulation on the drive circuit 120 may be performed to acquire the voltage Vg(n). Instead, if the W/L of the thin film transistors T6 to T9 are selected so as to satisfy the following relationship, the condition can be regarded as satisfied. In the case where the channel resistances of T6 to T9 are estimated according to the gradual channel approximation, it can be estimated that $\Delta \leq 0.01$ by selecting $(W_6/L_6)/(W_7/L_7)$ and $\beta_{R9}=(W_9/L_9)/(W_8/L_8)$ so as to satisfy the relationship of the following expression.

$$\beta_{R9} \cong \frac{(V_{DD}-V_{LL}-V_{TH})^2}{2(V_{DD}-V_{SS}-V_{TH})(V_{LL}-V_{SS})-(V_{LL}-V_{SS})^2}$$

$$V_{LL} = V_{SS} + V_{TH} + \sqrt{\frac{1}{100}\frac{W_6/L_6}{W_7/L_7}\cdot 2(V_{DD}-V_{SS})(V_{DD}-V_{SS}-2V_{th})}$$

where $V_{LL}$ denotes the voltage between the gate and source of the thin film transistor T7 when the channel resistance of the thin film transistor T7 is 100 times as high as the channel resistance of the thin film transistor T6. Thus, if $V_{DD}=+12$ V, $V_{SS}=0$ V and $V_{TH}=+4$ V, then $V_{LL}=+5.3$ V and $\beta_{R9}\geq 0.12$ are satisfied. In the embodiments 1-1, 1-2 and 1-3 having the channel widths and the channel lengths as shown in FIG. 14, the relationship of the above expression is satisfied.

(b) Output Voltage $V_L$ of Inverter is Threshold Voltage $V_{TH}$ or Less

At time t23, if the output voltage $V_L$ of the inverter is threshold voltage $(=V_{TH})$ of the thin film transistor T7 or less, the thin film transistor T7 can be in a non-conducting state more securely than under the condition (a). To verify whether the condition is satisfied or not, the voltage between the gate and the source of the thin film transistor T7 at the same time may be actually measured. Instead, the SPICE simulation on the drive circuit 120 may be performed to acquire the voltage between the gate and the source of the thin film transistor T7. To acquire threshold voltage $V_{TH}$, the transfer characteristic (Ids–Vgs characteristic) may be measured on a thin film transistor equivalent to the thin film transistors configuring the drive circuit 120. According to specific procedures, the voltage Vds between the drain and the source of the thin film transistor is set to about $V_{DD}-V_{SS}$ (e.g., +12 V), the voltage Vgs between the gate and the source is swept to measure the current Ids between the drain and the source in the saturation range. $V_{TH}$ denotes a point where a linear part of the plots according to $\sqrt{(Ids)}$–Vgs are extrapolated on the x-axis. Instead, if W/L ratios of the thin film transistors T8 and T9 are selected to satisfy the following relationship, the condition can be regarded as satisfied. In the case of estimating the voltage $V_L$ according to the gradual channel approximation, selection of $\beta_{R9}$ satisfying the following relationship allows $V_L \leq V_{TH}$ to be satisfied.

$$\beta_{R9} \cong \frac{(V_{DD}-2V_{TH})^2}{2(V_{DD}-V_{SS}-V_{TH})(V_{TH}-V_{SS})-(V_{TH}-V_{SS})^2}$$

If $V_{DD}=+12$ V, $V_{SS}=0$ V and $V_{TH}=+4$ V, $\beta_{R9}\geq 0.33$ is satisfied. In the embodiments 1-2 and 1-3, the relationship of the above expression is satisfied.

$\beta_{R9}$ may further be made greater than in the condition (b). The greater $\beta_{R9}$ is, the further the output voltage $V_L$ of the inverter from time t22 to t25 is reduced, which can advance transition of the thin film transistor T7 to the non-conducting state at time t23. Thus, the delay time from time t22 to time t23 can be reduced. That is, the delay time t23–t22 in the embodiment 1-3 is reduced in comparison with those in embodiments 1-1 and 1-2.

In this embodiment, the simple shift register 190 as illustrated in FIGS. 2A and 2B can be used. Accordingly, the circuit scale of the shift register 190 can be reduced. This reduction can, in turn, achieve reduction in layout area of the drive circuit 120 and improvement in manufacturing yield. Furthermore, the gate line voltage can be prevented from becoming the floating state. Accordingly, in the detection apparatus 100 including the active matrix panel, the readout image quality can be improved. In particular, a radiation imaging apparatus, which has many gate lines and is required to measure the charge amounts of pixels 110 at high resolution, significant improvement in image quality can be expected because the gate line potential in the non-selected period is stable. It is a matter of course that, in the case of applying this embodiment to a display device, such as an LCD, reduction in circuit scale and layout area, improvement in manufacturing yield and display image quality can be expected.

Second Embodiment

Figure 8:
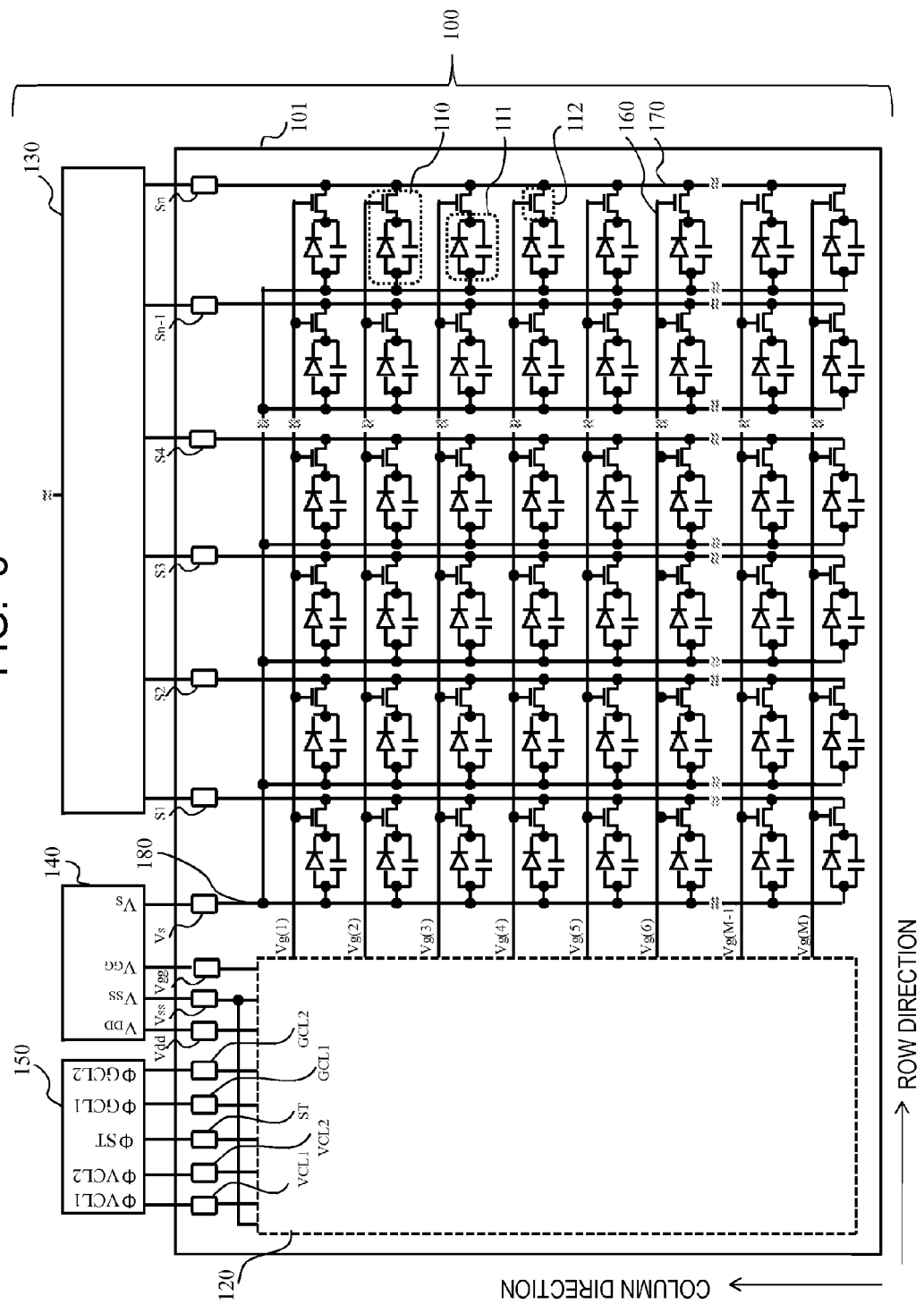
FIG. 8 is a diagram illustrating a configurational example of an active matrix panel relating to a second embodiment.

FIG. 8 is a diagram illustrating a configurational example of a detection apparatus including an active matrix panel according to a second embodiment of the present invention. FIG. 9A is a diagram illustrating configurational examples of a shift register 190 and a demultiplexer 195 in a drive circuit 120. The second embodiment is different from the first embodiment (FIGS. 1 and 2A) in that a third voltage $V_{GG}$ supplied to the drive circuit 120 is added according to a manner similar to that using the first voltage $V_{DD}$ and the second voltage $V_{SS}$. Note that $V_{GG}<V_{DD}-V_{TH}$ is satisfied. The internal configuration of the shift register unit circuit A(n) of this embodiment is the same as that of the first embodiment (FIG. 2B).

Figure 9B:
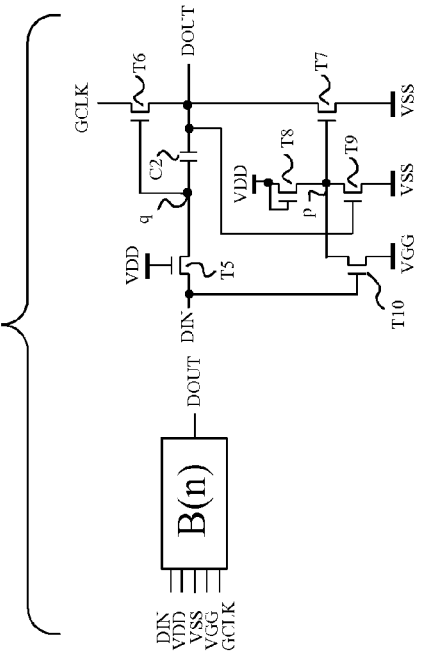
FIG. 9B is a diagram illustrating a configurational example of a shift register unit circuit relating to the second embodiment.
Figure 9A:
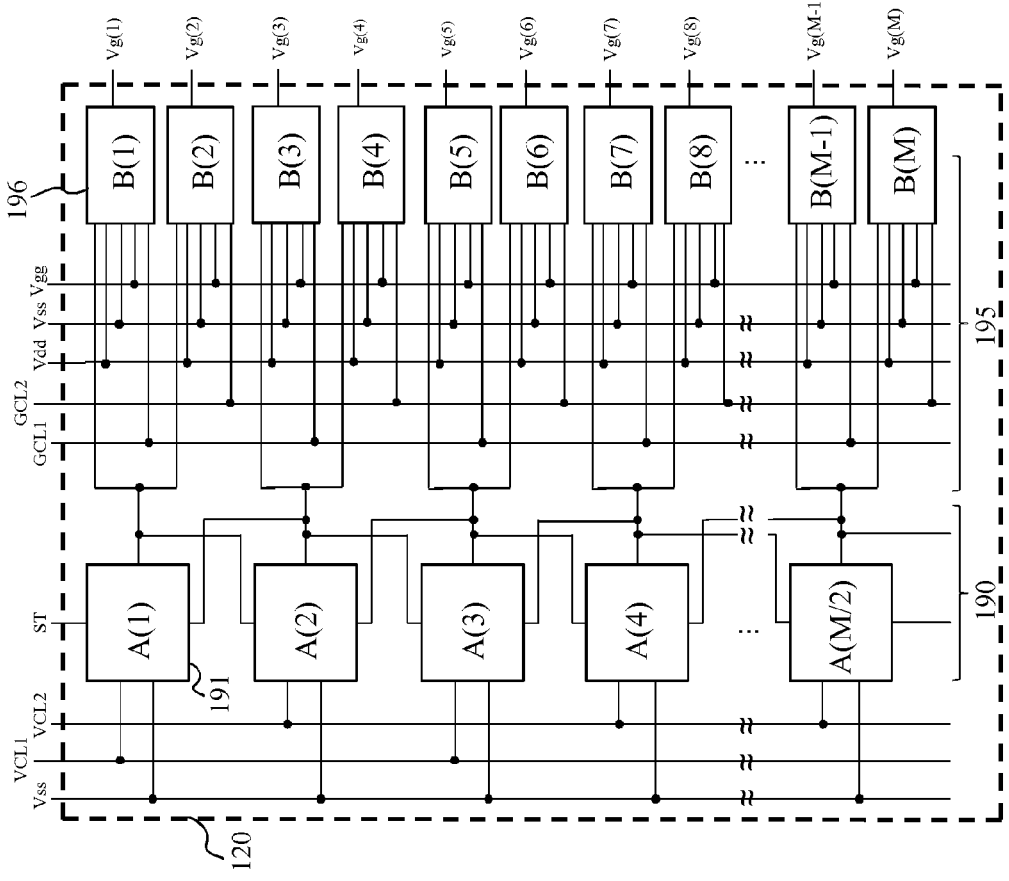
FIG. 9A is a diagram illustrating a configurational example of a drive circuit relating to the second embodiment.

FIG. 9B illustrates an internal configurational example of the demultiplexer unit circuit B(n). The demultiplexer unit circuit B(n) includes not only the thin film transistors T5 to T9 and the capacitance element C2 identical to those in the first embodiment but also a thin film transistor T10. The fifth transistor T10 is connected between the control electrode of the second transistor T7 and the node of the third voltage $V_{GG}$. The demultiplexer unit circuit B(n) includes not only the terminals DIN, DOUT, GCLK, VDD and VSS identical to those in the first embodiment but also a power source input terminal VGG.

Next, the operation of the drive circuit 120 will be described. The operation of the shift register 190 is analogous to that in the first embodiment. Also in this embodiment, the demultiplexer 195 operates in any of the normal mode, the pixel addition mode and the interlace mode. Hereinafter, only the operation of the demultiplexer 195 in the normal mode will be described.

Figure 10:
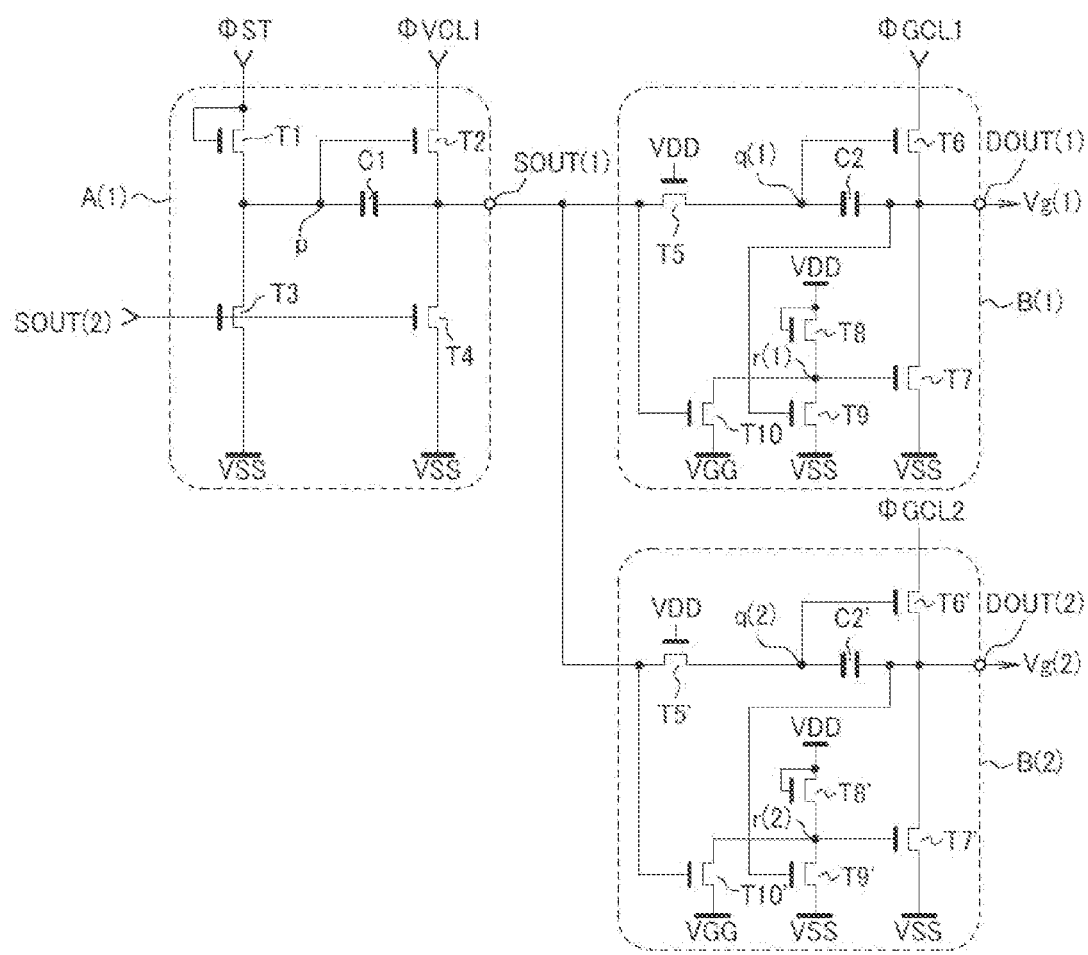
FIG. 10 is a circuit diagram illustrating in detail a leading section of the drive circuit relating to the second embodiment.

FIG. 10 is a circuit diagram illustrating a leading section of the drive circuit 120 in detail. This diagram includes a shift register unit circuit A(1) and demultiplexer unit circuits B(1) and B(2). The output voltages of the terminals DOUT of the demultiplexer unit circuits B(1) and B(2) are output voltages Vg(1) and Vg(2) to the gate lines on first and second rows, respectively.

Figure 11:
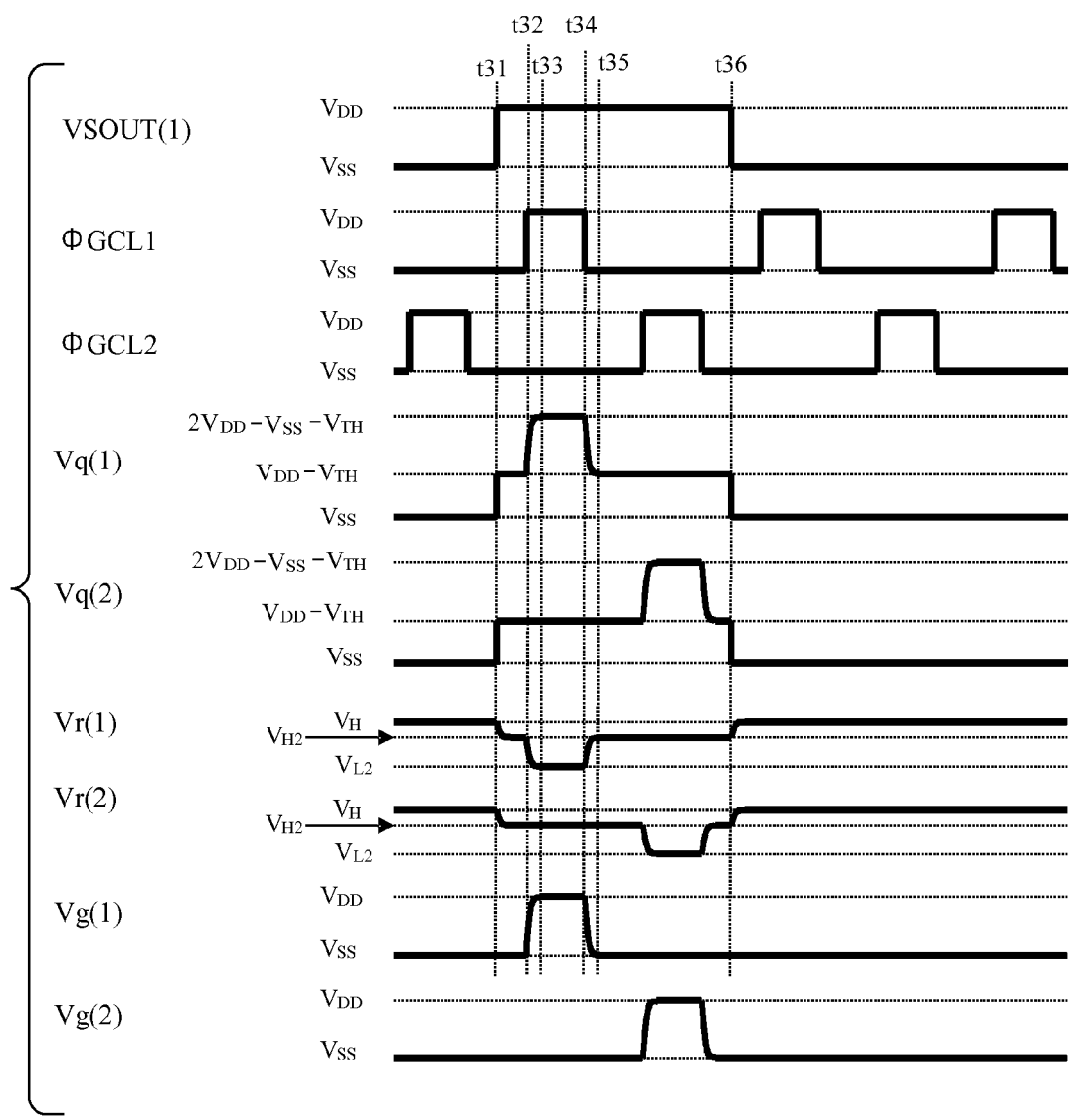
FIG. 11 is a timing chart illustrating an example of an operation in a normal mode relating to the second embodiment.

FIG. 11 is a timing chart illustrating the operations of the demultiplexer unit circuits B(1) and B(2) in the normal mode. Clock signals ΦGCL1 and ΦGCL2 have phases different from each other by 180 degrees. The temporal variations in voltages Vq(1), Vq(2), Vr(1) and Vr(2) at points q and r in the demultiplexer unit circuits B(1) and B(2) are also illustrated. Hereinafter, the operations will be sequentially described.

(A) Before Time t31

VSOUT(1)=Vq(1)=Vq(2)=$V_{SS}$ is satisfied. The thin film transistors T6 and T6' are in the non-conducting state. Vr(1)=Vr(2)=$V_H$ and Vg(1)=Vg(2)=$V_{SS}$ are satisfied. Both the thin film transistors T7 and T7' are in the conducting state.

(B) Time t31

When VSOUT(1)=$V_{DD}$ is satisfied, the voltages Vq(1) and Vq(2) are charged to $V_{DD}$-$V_{TH}$. As a result, until an aftermentioned time t36, the thin film transistors T6 and T6' are in the conducting state. This embodiment is different from the first embodiment in that the thin film transistors T10 and T10' are conductive. Accordingly, the voltages Vr(1) and Vr(2) become a voltage $V_{H2}$, which is determined by the channel resistance ratio of the thin film transistors T8 and T10 (T8' and T10'). Here, $V_{H2}$ can be estimated by the following expression.

$$V_{H2} = V_{GG} + (V_{DD} - V_{GG} - V_{TH}) \cdot \left( \frac{1 + \beta_{R10} - \sqrt{(1 + \beta_{R10})^2 - (1 + \beta_{R10})}}{1 + \beta_{R10}} \right)$$

where if the channel width and the channel length of the fifth transistor T10 are $W_{10}$ and $L_{10}$, respectively, $\beta_{R10}$=$(W_{10}/L_{10})$/$(W_8/L_8)$ is satisfied. $\beta_{R10}$ is selected such that $V_{H2} \geq V_{TH}$ is satisfied. Since $V_{H2}$ is at least the threshold voltage (=$V_{TH}$) of the thin film transistors T7 and T7', the thin film transistors T7 and T7' are in the conducting state. Since $V_{GG}$<$V_H$ is satisfied, $V_{H2}$<$V_H$ is satisfied. The thin film transistors T7 and T7' in this embodiment have higher channel resistances than those in the first embodiment. That is, the thin film transistors T7 and T7' in this embodiment are in a conducting state weaker than in the first embodiment.

(C) Time t32

At the instant of time t32, when the clock signal ΦGCL1 rises, the voltage Vg(1) is not immediately changed, and Vg(1)=$V_{SS}$, Vq(1)=$V_{DD}$-$V_{TH}$ and Vr(1)=$V_{H2}$ are satisfied. The thin film transistor T7 is maintained to be in a weak conducting state.

(D) Time t33

When about a time period τ elapses after time t32, the voltage Vq(1) is increased to 2$V_{DD}$-$V_{SS}$-$V_{TH}$, and the voltage Vg(1) becomes the constant value (=$V_{DD}$). At this time, the voltage Vr(1) becomes a value (=$V_{L2}$) determined by the channel resistance ratios of the thin film transistors T8, T9 and T10, and the thin film transistor T7 comes into the non-conducting state.

(E) Time t34

At the instant of time t34, when ΦGCL1=$V_{SS}$ gets satisfied, the voltage Vg(1) is not immediately changed as with time t32, and Vg(1)=$V_{DD}$, Vq(1)=2$V_{DD}$-$V_{SS}$-$V_{TH}$ and Vr(1)=$V_{L2}$ are satisfied. The thin film transistor T7 is in the non-conducting state.

(F) Time t35

When about a time period τ elapses after time t34, the voltage Vq(1) is reduced to $V_{DD}$-$V_{TH}$. Vg(1)=$V_{SS}$ and Vr(1)=$V_{H2}$ are satisfied, and the thin film transistor T7 comes into a weak conducting state equivalent to that at time t31. Then, up to time t36, a state where ΦGCL1=$V_{SS}$ and Vg(1)=$V_{SS}$ are satisfied is maintained.

(G) After time t35

The demultiplexer unit circuit B(2) operates in a manner analogous to the above ones. That is, the voltages Vq(2), Vr(2) and Vg(2) and the conducting/non-conducting state of the thin film transistor T7' vary according to transition of the clock signal ΦGCL2, as described above.

(H) Time t36

VSOUT(1)=$V_{SS}$ is satisfied, and the thin film transistors T6 and T6' come into the non-conducting state. Both the thin film transistors T7 and T7' are in the conducting state, and Vg(1)=Vg(2)=$V_{SS}$ and Vr(1)=Vr(2)=$V_H$ are satisfied.

(I) After time t36

Unless VSOUT(1) becomes $V_{DD}$ again, the thin film transistors T6 and T6' are maintained in the non-conducting state. Both the thin film transistors T7 and T7' are maintained in the conducting state. The state where Vg(1)=Vg(2)=$V_{SS}$ and Vr(1)=Vr(2)=$V_H$ are satisfied is stably maintained. That is, irrespective of the states of the clock signals ΦGCL1 and ΦGCL2, the gate lines on the first and second rows are connected to the second voltage $V_{SS}$ by the thin film transistors T7 and T7' in the conducting state, and do not come into the floating state.

As described above, from (A) to (I), at least one of the thin film transistors T6 and T7 (thin film transistors T6' and T7') is in the conducting state. Accordingly, the gate line on the first row (second row) is not in the floating state. In conformity with the operations of the shift register unit circuits A(2), A(3), . . . , the shift register unit circuit B(3) and subsequent circuits operate in an analogous manner. The gate lines on and after the third row are not in the floating state.

FIG. 15 illustrates one example of the channel width and the channel length and the voltage $V_{GG}$ of each thin film transistor applicable to this embodiment. C1=0.5 pF and C2=10 pF are satisfied. In this embodiment, the W/L ratio (=$(W_6/L_6)/(W_7/L_7)$) of the thin film transistor T6 to the W/L ratio of the thin film transistor T7 is set to be equivalent or higher, as with the first embodiment. To allow the thin film transistor T7 at time t33 to substantially be regarded as the non-conducting state, any of the following conditions (c) and (d) is required to be satisfied at the same time.

(c) Channel Resistance of Thin Film Transistor T7 100 Times or More as High as Channel Resistance of Thin Film Transistor T6

To allow the thin film transistor T7 at time t33 to substantially be regarded as the non-conducting state, the channel resistance of the thin film transistor T7 is required to be 100 times or more as high as the channel resistance of the thin film transistor T6 at the same time in this embodiment, as with the first embodiment. To verify whether the condition is satisfied or not, the voltage Vg(n) may be actually measured at the same time or the SPICE simulation is performed to thereby acquire the voltage Vg(n). Instead, if the estimated value of the voltage Vr(n) at time t33 according to the following expression is equal to or less than $V_{LL}$ defined in the first embodiment, the channel resistance of the thin film transistor T7 can be assumed to be 100 times or more as high as the channel resistance of the thin film transistor T6.

$$Vr(n) = V_{DD} - V_{TH} - \sqrt{(V_{DD} - V_{TH})^2 - \frac{(V_{DD} - V_{TH})^2 + 2(V_{DD} - V_{TH})(\beta_{R9}V_{SS} + \beta_{R10}V_{GG}) - (\beta_{R9}V_{SS}^2 + \beta_{R10}V_{GG})^2}{1 + \beta_{R9} + \beta_{R10}}}$$

If $V_{DD}=+12$ V, $V_{SS}=0$ V, $V_{GG}=V_{SS}+2$ V and $V_{TH}=+4$ V are met, $Vr(n) \leq V_{LL}$ is satisfied in the embodiments 2-1, 2-2 and 2-3 having the channel widths and the channel lengths as shown in FIG. 15.

(d) Output Voltage $V_L$ of Inverter is $V_{TH}$ or Less

At time t33, if the output voltage $V_L$ of the inverter can be equal to or less than the threshold voltage ($=V_{TH}$) of the thin film transistor T7, the thin film transistor T7 can come into a secure non-conducting state than under the condition (c). To verify whether the condition is satisfied or not, the voltage between the gate and the source of the thin film transistor T7 at the same time may be actually measured or the SPICE simulation may be performed to acquire the voltage between the gate and the source of the thin film transistor T7. Instead, through use of the estimated value of the voltage Vr(n) described in (c), if $Vr(n) \leq V_{TH}$ is confirmed, the condition can be considered as satisfied. In the embodiments 2-2 and 2-3, the above relationship is satisfied.

In this embodiment, $\beta_{R9}$ and $\beta_{R10}$ may be increased more than those under the condition (d), as with the first embodiment. The greater $\beta_{R9}$ and $\beta_{R10}$ are, the more the output voltage $V_L$ of the inverter from time t32 to time t35 is reduced, which can advance transition of the thin film transistor T7 to the non-conducting state at time t33. Thus, the delay from time t32 to time t33 can be reduced. That is, the delay t33-t32 in the embodiment 2-3 is shortened compared to that in the embodiments 2-1 and 2-2. Furthermore, as with the embodiment 2-4, $V_{GG}=V_{SS}$ may be satisfied. In this case, the layouts of the drive circuit 120 and the power source 140 can be simplified.

Also in this embodiment, the simple shift register 190 can be employed as with the first embodiment. Accordingly, the circuit scale can be reduced. Thus, reduction in layout area of the drive circuit 120 and improvement in manufacturing yield can be achieved. As with the embodiment 2-3, the channel width of the thin film transistor T10 (T10') can be selected to be significantly small. Accordingly, adverse effects on the layout area of the thin film transistor T10 (T10') is insignificant.

The circuit scale of the shift register 190 is reduced with respect to the circuit scale of the entire drive circuit 120 to thereby allow reduction in cost, because of the following reasons. In processes of manufacturing thin film transistors, defects of the thin film transistors due to particles occur at a certain probability on each thin film transistor, irrespective of the positions of the thin film transistors. As to the drive circuit in the U.S. 2008/0316156, when the circuit scales are compared between those of the scan voltage generation circuit and the shift register, the circuit scale of the shift register is larger. According to U.S. 2008/0316156, if any one of the thin film transistors in the shift register does not operate, the register does not function as a product without being repaired. That is, it is difficult to produce the drive circuit in U.S. 2008/0316156 at low cost in a factory with a high failure rate of thin film transistors. On the contrary, in this embodiment, if the shift register includes no failed thin film transistor and if a failed thin film transistor occurs in the scan voltage generation circuit, only one gate line does not operate (line defect occurs), which causes no problem in some types of products.

Furthermore, the gate line voltage can be prevented from entering the floating state. Accordingly, the readout image quality of the detection apparatus including the active matrix panel can be improved. Furthermore, the voltage Vr is reduced before time t32, thereby causing the inverting operation of the inverter from time t32 to time t33 to be performed more securely than in the first embodiment. Accordingly, in this embodiment, more timing margin and voltage margin of the clock signals ΦGCL1 and ΦGCL2 can be secured than in the first embodiment.

Third Embodiment

Figure 12A:
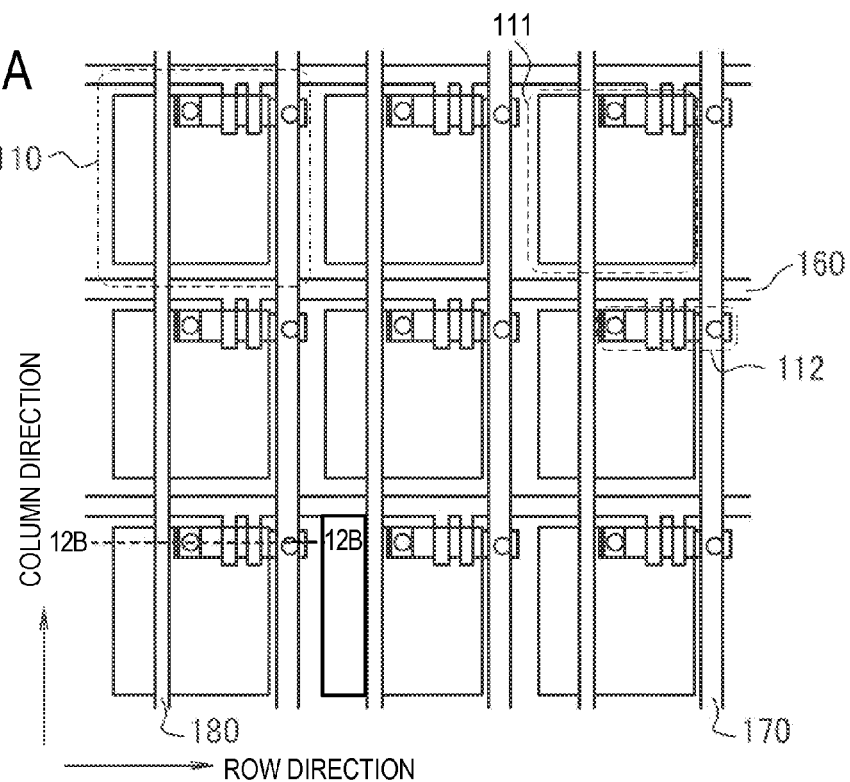
FIG. 12A is a schematic plan view illustrating a configurational example of pixels of a radiation detection apparatus.
Figure 12B:
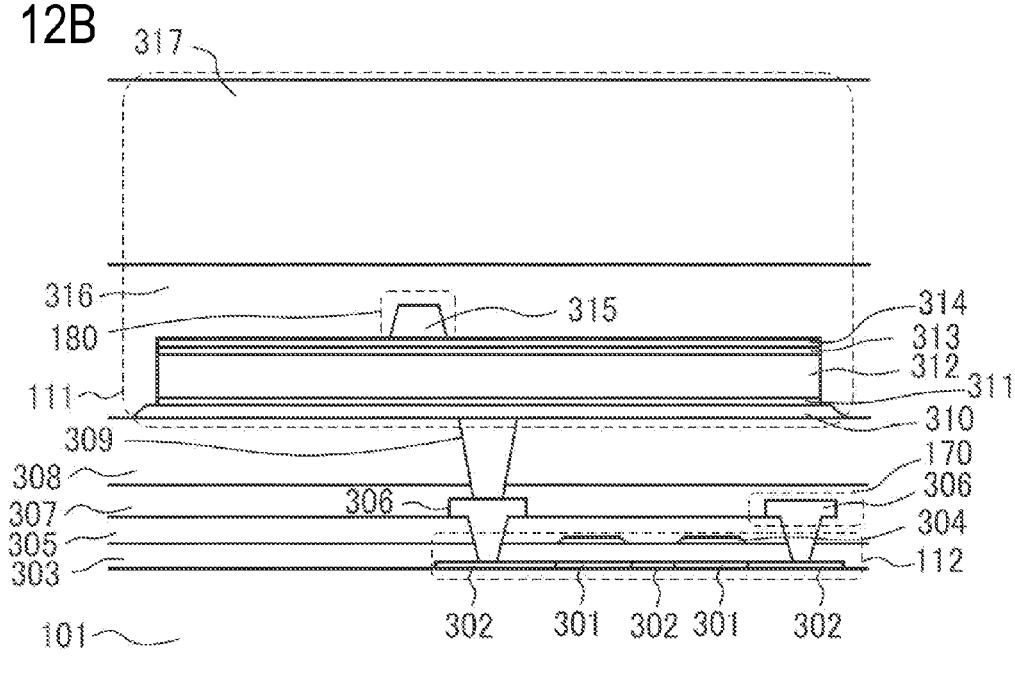
FIG. 12B is a schematic sectional view illustrating a configurational example of the pixels.

FIGS. 12A and 12B are configurational examples of pixels of a radiation detection apparatus including an active matrix panel according to a third embodiment of the present invention. FIG. 12A is a plan view. FIG. 12B is a sectional view taken along line 12B-12B of FIG. 12A. In this embodiment, a switching element 112 is a top gate and double gate polycrystalline silicon thin film transistor. The switching element 112 has a configuration in which, on an insulating substrate 101, a polycrystalline silicon layer including an intrinsic semiconductor region 301 and a first conductive-type impurity semiconductor region 302, a first insulating layer 303 and a first conductive layer 304 are stacked sequentially from the insulating substrate 101. The intrinsic semiconductor region 301 functions as a channel of the thin film transistor. The impurity semiconductor region 302 functions as one of the source and the drain. The first insulating layer 303 functions as a gate insulating layer. The first conductive layer 304 functions as one of the gate and a gate line 160. The switching element 112 is covered with a second insulating layer 305. The second insulating layer 305 functions as a passivation layer for the switching element 112. A second conductive layer 306 provided on the second insulating layer 305 is connected to the impurity semiconductor region 302 at a contact hole provided in the second insulating layer 305 and the first insulating layer 303. The second conductive layer 306 connected to the impurity semiconductor region 302, which is one of the source and the drain, functions as a connection terminal to the conversion element 110. The second conductive layer 306 connected to the impurity semiconductor region 302, which is the other one of the source and the drain, functions as a signal line 170. The second conductive layer 306 is covered with a third insulating layer 307. The third insulating layer 307 functions as a passivation layer for the switching element 112 and the signal line 170. The third insulating layer 307 is covered with a fourth insulating layer 308. The fourth insulating layer 308 is made of an organic insulating material. The layer 308 is prepared to have a large thickness, which allows this layer to function as a flatting layer. The conversion element 111 is provided on the fourth insulating layer 308. Conversion elements 111 correspond to the switching elements 112, and convert radiation into charges. In this embodiment, the conversion element 111 may include a scintillator 317 converting radiation into light, and a photoelectric conversion element converting the light into charges. The photoelectric conversion element has a configuration in which a third conductive layer 310, a first conductive-type impurity semiconductor layer 311, an intrinsic semiconductor layer 312, a second conductive-type impurity semiconductor layer 313 and a fourth conductive layer 314 are sequentially stacked from the insulating substrate 101. The third conductive layer 310 functions as a first electrode of the conversion element 111, and is connected to the second conductive layer 306 at the contact hole 309 provided at the third insulating layer 307 and the fourth insulating layer 308. The first conductive-type impurity semiconductor layer 311, the intrinsic semiconductor layer 312, and the second conductive-type impurity semiconductor layer 313 are made of amorphous silicon. The fourth conductive layer 314 functions as a second electrode of the conversion element 111, and is connected to a fifth conductive layer 315 functioning as an electrode wiring 180. The photoelectric conversion element and the electrode wiring 180 are covered with a fifth insulating layer 316. The scintillator 317 is disposed on the fifth insulating layer 316.

Here, in this embodiment, the conversion element 111 is an indirect conversion element including the scintillator converting radiation into light and the photoelectric conversion element converting the light into charges. This embodiment is not limited thereto. Instead, the conversion element 111 may be a direct conversion element directly converting radiation into charges by amorphous selenium. The switching element 112 is the polycrystalline silicon thin film transistor. However, this embodiment is not limited thereto. An amorphous silicon thin film transistor, an oxide thin film transistor including oxide semiconductor, and an organic thin film transistor including organic semiconductor may be used. Instead, another semiconductor material, such as germanium, may be employed.

Figure 13:
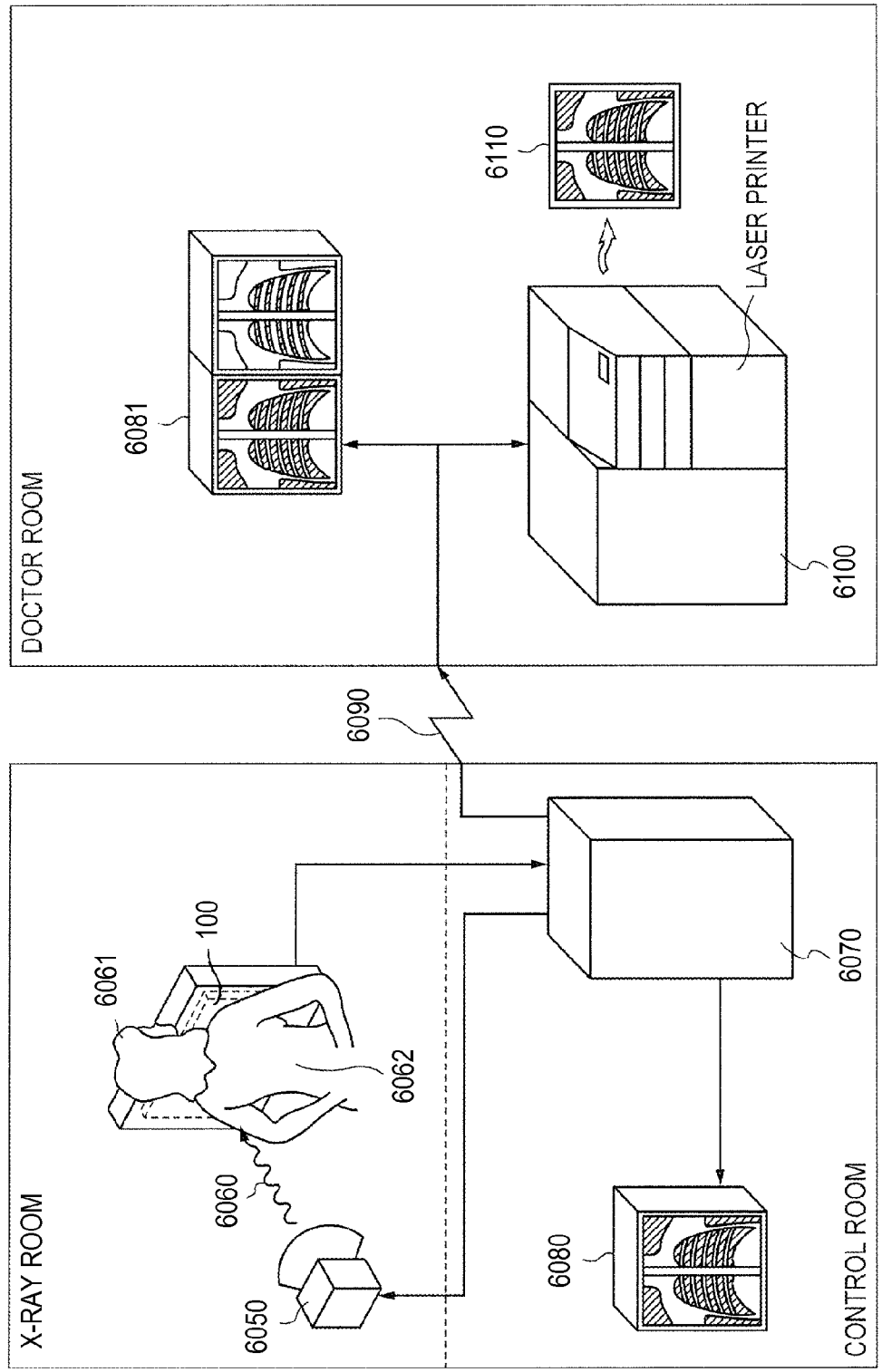
FIG. 13 is a diagram illustrating a configurational example of a radiation detection system.

FIG. 13 illustrates an example of a radiation detection system including the radiation detection apparatus. X-rays 6060 generated in an X-ray tube 6050, which is a radiation source, pass through a chest 6062 of a patient or a subject 6061, and enter the radiation detection apparatus (active matrix panel) 100. The incident X-rays include information on the interior of the body of the patient 6061. The radiation detection apparatus 100 converts radiation into charges in response to the incidence of the X-rays, and acquires electric information. The information is converted into digital data, and subjected to image processing by an image processor 6070, which is a signal processing unit, thereby allowing observation on a display 6080, which is a display unit in a control room. Furthermore, the information can be remotely transferred by a transmission processing system, such as a telephone line 6090. Accordingly, the information can be displayed on a display 6081, which is a display unit, in a doctor room, which is another place, and stored in a recording unit, such as an optical disk. Thus, a doctor at a remote place can perform diagnosis. Furthermore, the information can be recorded on a film 6110, which is a recording medium, by a film processor 6100, which is a recording unit.

The active matrix panels according to the first to third embodiments are applicable to detection apparatuses and detection systems that are applied to medical image diagnosis apparatuses, non-destructive testing instruments, analyzers using radiation. Furthermore, the panels are applicable to display devices including active matrix panels.

The embodiments only exemplify specific examples for implementing the present invention. The technical scope of the present invention is not construed in a limited manner according to these embodiments. That is, the present invention can be implemented in various forms without departing from the technical scope or the principal characteristics thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-128972, filed Jun. 6, 2012, which is hereby incorporated by reference herein in its entirety.

What is claimed is:

1. A detection apparatus comprising:
a plurality of conversion elements for converting radiation or light into a charge;
a plurality of transistors corresponding to the conversion elements to output an electric signal in accordance with the converted charge;
a gate line connected to control electrodes of the transistors; and
a drive circuit supplying the gate line with a conducting voltage in which the transistors are in a conductive state and a non-conducting voltage in which the transistors are in a non-conductive state,
wherein the drive circuit comprises a shift register comprising a plurality of shift register unit circuits connected to each other, and a demultiplexer comprising a plurality of demultiplexer unit circuits into which output signals of the plurality of shift register unit circuits are respectively input,
wherein the demultiplexer unit circuit comprises a first transistor and a second transistor, and the first transistor supplies the conducting voltage to the gate line at the conductive state and does not supply the conducting voltage to the gate line at the non-conductive state, and the second transistor supplies the non-conducting voltage to the gate line at the conductive state and does not supply the non-conducting voltage to the gate line at the non-conductive state, and
wherein the first transistor is changed from the non-conducting state into the conducting state when the second transistor is in the conducting state.

2. The detection apparatus according to claim 1, wherein after the voltage of the gate line is changed to the conducting voltage, the second transistor comes into the non-conducting state.

3. The detection apparatus according to claim 1, wherein the demultiplexer unit circuit further comprises an inverter that receives a potential of a mutual connection node among the first transistor, the second transistor, and the gate line as an input signal, and outputs a signal where the input signal is inverted, to the control electrode of the second transistor, and
wherein the inverter comprises a third transistor supplying a first voltage to the control electrode of the second transistor, and a fourth transistor supplying a second voltage to the control electrode of the second transistor.

4. The detection apparatus according to claim 3, wherein if the first voltage is $V_{DD}$, the second voltage is $V_{SS}$, a channel width and a channel length of the first transistor are $W_6$ and $L_6$, respectively, a channel width and a channel length of the second transistor are $W_7$ and $L_7$, respectively, a channel width and a channel length of the third transistor are $W_8$ and $L_8$, respectively, a channel width and a channel length of the fourth transistor are $W_9$ and $L_9$, respectively, and an average value of threshold voltages of the first to fourth transistors is $V_{TH}$, a following expression is satisfied:

$$\frac{W_9/L_9}{W_8/L_8} \geq \frac{(V_{DD} - V_{LL} - V_{TH})^2}{2(V_{DD} - V_{SS} - V_{TH})(V_{LL} - V_{SS}) - (V_{LL} - V_{SS})^2}$$

$$V_{LL} = V_{SS} + V_{TH} + \sqrt{\frac{1}{100} \frac{W_6/L_9}{W_7/L_7} \cdot 2(V_{DD} - V_{SS})(V_{DD} - V_{SS} - 2V_{th})}.$$

5. The detection apparatus according to claim 4, wherein after the voltage of the gate line is changed to the conducting voltage, a voltage of the control electrode of the second transistor becomes equal to or lower than a threshold voltage of the second transistor.

6. The detection apparatus according to claim 5, wherein a following expression is satisfied:

$$\frac{W_9/L_9}{W_8/L_8} \geq \frac{(V_{DD} - 2V_{TH})^2}{2(V_{DD} - V_{SS} - V_{TH})(V_{Th} - V_{SS}) - (V_{TH} - V_{SS})^2}.$$

7. The detection apparatus according to claim 3, wherein the demultiplexer unit circuit comprises a fifth transistor connected between the control electrode of the second transistor and a node of the third voltage, and wherein if a channel width and a channel length of the fifth transistor are $W_{10}$ and $L_{10}$, respectively, $\beta_{R9} = (W_9/L_9)/(W_8/L_8)$ and $\beta_{R10} = (W_{10}/L_{10})/(W_8/L_8)$ are satisfied, and an average value of threshold voltages of the first to fifth transistors is $V_{TH}$, a following expression is satisfied:

$$V_{DD} - V_{TH} - \sqrt{(V_{DD} - V_{TH})^2 - \frac{(V_{DD} - V_{TH})^2 + 2(V_{DD} - V_{TH})(\beta_{R9}V_{SS} + \beta_{R10}V_{GG}) - (\beta_{R9}V_{SS}^2 + \beta_{R10}V_{GG}^2)}{1 + \beta_{R9} + \beta_{R10}}} \leq V_{LL}.$$

8. The detection apparatus according to claim 7, wherein a following expression is satisfied:

$$V_{DD} - V_{TH} - \sqrt{(V_{DD} - V_{TH})^2 - \frac{(V_{DD} - V_{TH})^2 + 2(V_{DD} - V_{TH})(\beta_{R9}V_{SS} + \beta_{R10}V_{GG}) - (\beta_{R9}V_{SS}^2 + \beta_{R10}V_{GG}^2)}{1 + \beta_{R9} + \beta_{R10}}} \leq V_{TH}.$$

9. The detection apparatus according to claim 1, wherein after the voltage of the gate line is changed to the conducting voltage, a channel resistance ratio of the second transistor to the first transistor becomes 100 times or more.

10. A detection system comprising:
the detection apparatus according to claim 1; and
a signal processing unit that processes a signal from the detection apparatus.

\* \* \* \* \*